(12) United States Patent
Jeong et al.

(10) Patent No.: US 11,222,936 B2
(45) Date of Patent: Jan. 11, 2022

(54) ORGANIC LIGHT-EMITTING DISPLAY APPARATUS AND METHOD OF MANUFACTURING THE SAME

(71) Applicant: Samsung Display Co., Ltd., Yongin-si (KR)

(72) Inventors: Sehoon Jeong, Yongin-si (KR); Hyeyong Chu, Yongin-si (KR); Jaesik Kim, Yongin-si (KR); Yeonhwa Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/585,240

(22) Filed: Sep. 27, 2019

(65) Prior Publication Data

US 2020/0212143 A1 Jul. 2, 2020

(51) Int. Cl.
| | |
|---|---|
| *H01L 27/32* | (2006.01) |
| *H01L 51/00* | (2006.01) |
| *H01L 51/52* | (2006.01) |
| *H01L 51/56* | (2006.01) |

(52) U.S. Cl.
CPC ...... *H01L 27/3246* (2013.01); *H01L 51/0016* (2013.01); *H01L 51/5218* (2013.01); *H01L 51/5253* (2013.01); *H01L 51/56* (2013.01); *H01L 2227/323* (2013.01); *H01L 2251/5315* (2013.01)

(58) Field of Classification Search
None
See application file for complete search history.

(56) References Cited

U.S. PATENT DOCUMENTS

| | | |
|---|---|---|
| 5,953,585 A | 9/1999 | Miyaguchi |
| 6,369,495 B2 | 4/2002 | Codama et al. |
| 7,592,635 B2 | 9/2009 | Chung et al. |
| 7,615,388 B2 * | 11/2009 | Kashiwabara ...... H01L 51/0018 438/29 |
| 9,091,913 B2 | 7/2015 | Katz et al. |
| 9,147,842 B2 | 9/2015 | Lee et al. |
| 9,219,253 B2 | 12/2015 | Izumi et al. |
| 9,231,211 B2 | 1/2016 | Lee et al. |
| 9,425,438 B2 | 8/2016 | Kim et al. |
| 9,437,843 B2 | 9/2016 | Suh |
| 9,541,829 B2 | 1/2017 | Robello et al. |

(Continued)

FOREIGN PATENT DOCUMENTS

| | | |
|---|---|---|
| JP | 1997-330792 | 12/1997 |
| KR | 10-1994-0025393 | 11/1994 |

(Continued)

*Primary Examiner* — Robert K Carpenter
(74) *Attorney, Agent, or Firm* — H.C. Park & Associates, PLC

(57) ABSTRACT

An organic light-emitting display apparatus including: a substrate; a pixel electrode located on the substrate; a pixel-defining film coveting an end portion of the pixel electrode; an intermediate layer located on the pixel electrode and including an emission layer; a counter electrode located on the intermediate layer; a passivation layer located on the counter electrode and including a cover portion covering a top surface of the counter electrode and a protrusion extending from an end portion of the cover portion away from the substrate; and an encapsulation member covering the passivation layer.

14 Claims, 25 Drawing Sheets

(56) References Cited

U.S. PATENT DOCUMENTS

| | | | |
|---|---|---|---|
| 2017/0365812 A1 | 12/2017 | Choung et al. | |
| 2018/0190907 A1 | 7/2018 | Kim et al. | |
| 2019/0157500 A1* | 5/2019 | Cheng | H01L 21/02002 |
| 2019/0165063 A1* | 5/2019 | Lee | H01L 27/3276 |
| 2020/0161394 A1* | 5/2020 | Jeon | H01L 27/3246 |

FOREIGN PATENT DOCUMENTS

| | | |
|---|---|---|
| KR | 10-0864001 | 10/2008 |
| KR | 10-0971751 | 7/2010 |
| KR | 10-2015-0063841 | 6/2015 |
| KR | 10-2017-0142231 | 12/2017 |
| KR | 10-2018-0080416 | 7/2018 |
| KR | 10-2020-0075192 | 6/2020 |
| WO | 2015089062 | 6/2015 |
| WO | 2020130244 | 6/2020 |

\* cited by examiner

ORGANIC LIGHT-EMITTING DISPLAY APPARATUS AND METHOD OF MANUFACTURING THE SAME

CROSS-REFERENCE TO RELATED APPLICATION

This application claims priority from and the benefit of Korean Patent Application No. 10-2018-0169910, filed on Dec. 26, 2018, which is hereby incorporated by reference for all purposes as if fully set forth herein.

BACKGROUND

Field

Exemplary embodiments of the present invention relate to an organic light-emitting display apparatus and a method of manufacturing the same, and more particularly, to an organic light-emitting display apparatus for reducing defects and enlarging an emission area and a method of manufacturing the organic light-emitting display apparatus.

Discussion of the Background

An organic light-emitting display apparatus includes a hole injection electrode, an electron injection electrode, and an organic light-emitting device (OLED) including an organic emission layer that is formed between the hole injection electrode and the electron injection electrode. The organic light-emitting display apparatus is a self-emissive display apparatus that generates light when excitons generated when holes injected from the hole injection electrode and electrons injected from the electron injection electrode combine with each other in the organic emission layer change from an excited state to a ground state.

Although a fine metal mask (FMM) may be used as technology for depositing an organic emission layer on a substrate, there are limitations in manufacturing a high-resolution organic light-emitting display apparatus due to the shadow effect of the FMM, and thus, there is a demand for alternative deposition technology.

The above information disclosed in this Background section is only for understanding of the background of the inventive concepts, and, therefore, it may contain information that does not constitute prior art.

SUMMARY

Exemplary embodiments of the present invention provide an organic light-emitting display apparatus for reducing defects and enlarging an emission area and a method of manufacturing the organic light-emitting display apparatus.

Additional features of the inventive concepts will be set forth in the description which follows, and in part will be apparent from the description, or may be learned by practice of the inventive concepts.

An exemplary embodiment of the present invention provides an organic light-emitting display apparatus including: a substrate; a pixel electrode located on the substrate; a pixel-defining film covering an end portion of the pixel electrode; an intermediate layer located on the pixel electrode and including an emission layer; a counter electrode located on the intermediate layer; a passivation layer located on the counter electrode and including a cover portion covering a top surface of the counter electrode and a protrusion extending from an end portion of the cover portion away from the substrate; and an encapsulation member covering the passivation layer.

An area of the cover portion of the passivation layer may be greater than an area of the counter electrode.

The protrusion of the passivation layer may have a closed loop shape surrounding the counter electrode.

The protrusion of the passivation layer may have a width decreasing away from the substrate.

A reflectance of the pixel electrode may be higher than a reflectance of the counter electrode.

A reflectance of the pixel electrode may be higher than a reflectance of the passivation layer.

The end portion of the cover portion may directly contact a top surface of the pixel-defining film.

A bottom surface of the protrusion may directly contact the top surface of the pixel-defining film.

The organic light-emitting display apparatus may further include an additional structure located on the pixel-defining film to have a closed loop shape.

The intermediate layer may be formed to have an island pattern.

The counter electrode may be formed to have an island pattern.

The encapsulation member may include at least one organic layer including an organic material and at least one inorganic layer including an inorganic material.

The at least one organic layer may directly contact the passivation layer, and the at least one inorganic layer may be located on the at least one organic layer.

The at least one inorganic layer may include a first inorganic layer directly contacting the passivation layer and a second inorganic layer located on the at least one organic layer.

Another exemplary embodiment of the present invention provides a method of manufacturing an organic light-emitting display apparatus including: forming, on a substrate, a pixel electrode and a pixel-defining film covering an end portion of the pixel electrode; sequentially forming a lift-off layer and a photoresist, on the pixel electrode and the pixel-defining film; forming an opening exposing a top surface of the pixel electrode and a part of the pixel-defining film, by patterning the lift-off layer and the photoresist; sequentially forming, in the opening and on the photoresist, an intermediate layer including an emission layer and a counter electrode; forming a passivation layer including a cover portion covering a top surface and an end portion of the counter electrode in the opening, and a protrusion covering a side surface of the lift-off layer exposed through the opening and extending from an end portion of the cover portion away from the substrate; and removing a remaining photoresist and a remaining lift-off layer.

The passivation layer may be formed by using a deposition process having higher step coverage than the counter electrode.

The remaining lift-off layer may be removed by being dissolved with a solvent.

The remaining photoresist may be removed by attaching a dry film to the remaining photoresist.

The remaining photoresist may be removed by using chemical mechanical polishing (CMP).

The remaining lift-off layer may be removed by using a lift-off method, along with the remaining photoresist.

The remaining lift-off layer may be removed by using anisotropic etching.

The anisotropic etching may be performed by using dry etching.

The method may further include, after the removing of the remaining photoresist and the remaining lift-off layer, forming an encapsulation member including at least one organic layer including an organic material and at least one inorganic layer including an inorganic material Another exemplary embodiment of the present invention provides a method of manufacturing an organic light-emitting display apparatus including: forming, on a substrate, a pixel electrode and a pixel-defining film covering an end portion of the pixel electrode; forming an additional structure on the pixel-defining film; sequentially forming an intermediate layer including an emission layer and a counter electrode by using a mask having an opening, on the pixel electrode and the pixel-defining film; and forming a passivation layer including a cover portion covering a top surface and an end portion of the counter electrode, and a protrusion covering a side surface of the additional structure and extending from an end portion of the cover portion away from the substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
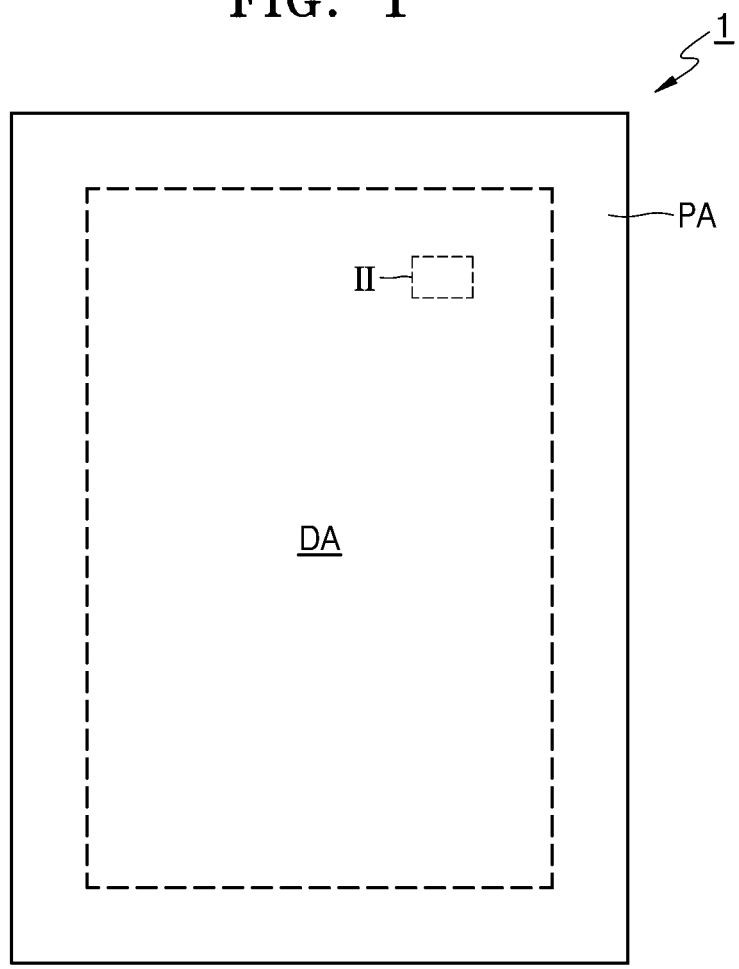
FIG. 1 is a plan view of an organic light-emitting display apparatus according to a first exemplary embodiment of the present invention.

In the following description, for the purposes of explanation, numerous specific details are set forth in order to provide a thorough understanding of various exemplary embodiments of the invention. As used herein "embodiments" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
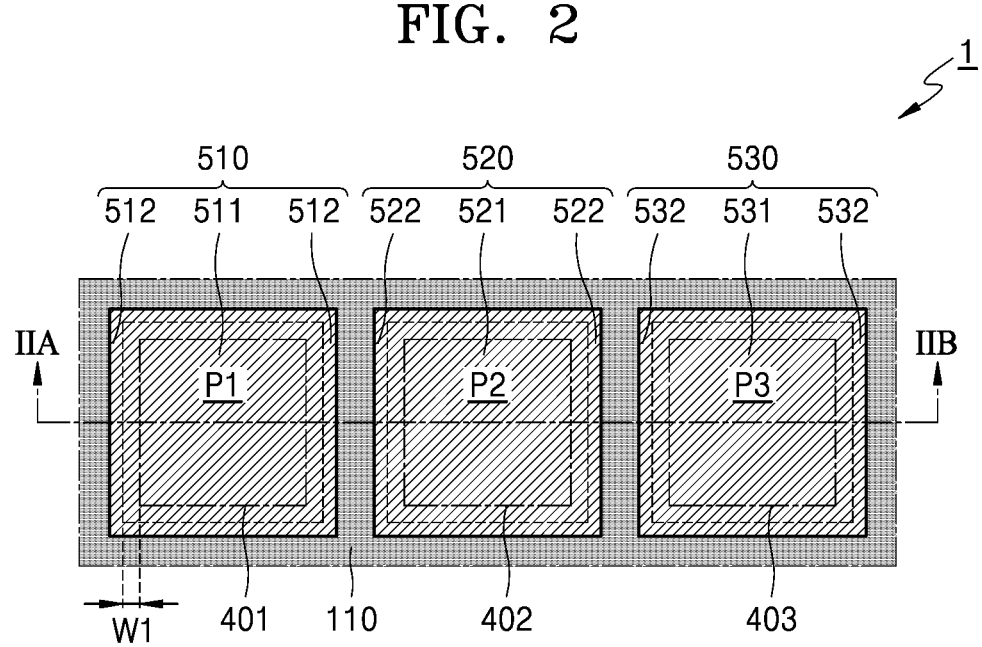
FIG. 2 is a plan view illustrating a region II of FIG. 1.
Figure 3:
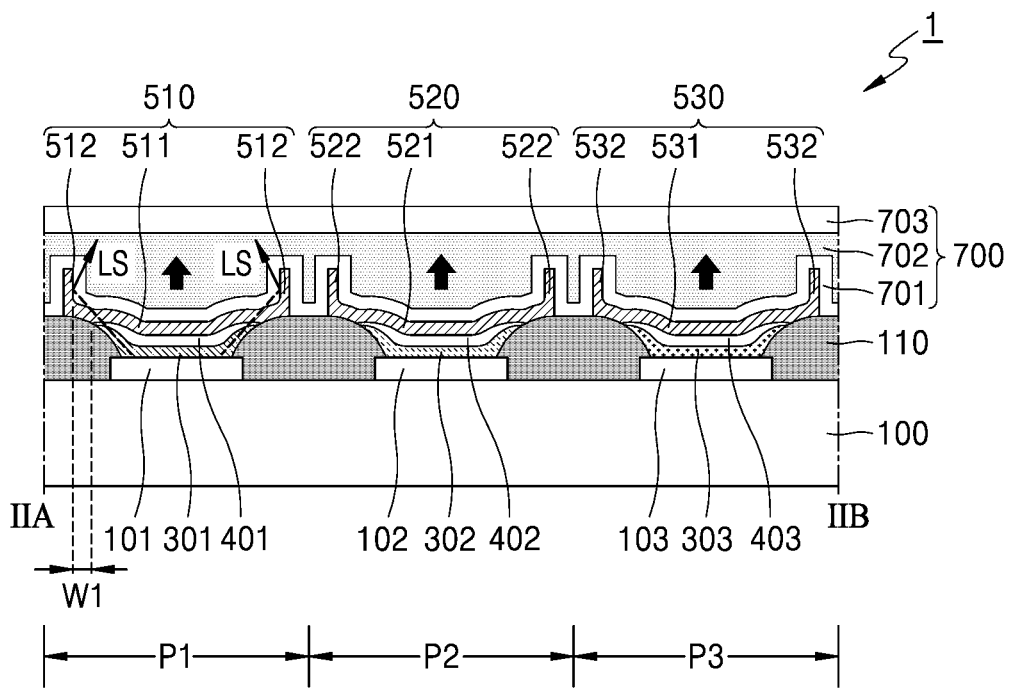
FIG. 3 is a cross-sectional view taken along line IIA-IIB of FIG. 2.

FIG. 1 is a plan view of an organic light-emitting display apparatus 1 according to a first exemplary embodiment of the present invention. FIG. 2 is a plan view illustrating a region II of FIG. 1. FIG. 3 is a cross-sectional view taken along line IIA-IIB of FIG. 2.

Referring to FIGS. 1 through 3, the organic light-emitting display apparatus 1 according to the present exemplary embodiment includes a display area DA and a peripheral area PA located on a substrate 100.

The display area DA is an area in which a predetermined image is provided by using light emitted by a pixel, and the peripheral area PA, which is an area in which an image is not provided, surrounds the display area DA. Various drivers and pads, such as a data driver for providing a data signal and a scan driver for providing a scan signal to the pixel of the display area DA, may be located in the peripheral area PA.

FIG. 1 showing the region II illustrates a unit pixel of the organic light-emitting display apparatus 1 including first through third sub-pixels P1, P2, and P3. For example, the first sup-pixel P1 may emit red light, the second sub-pixel P2 may emit green light, and the third sub-pixel P3 may emit blue light. Although three sub-pixels are shown in the present exemplary embodiment, the inventive concepts are not limited thereto.

In the first through third sub-pixels P1, P2, and P3, a first pixel electrode 101, a second pixel electrode 102, and a third pixel electrode 103 are located on the substrate 100 to be spaced apart from one another.

A pixel-defining film 110 defines a pixel by having openings through which top surfaces of the first through third pixel electrodes 101, 102, and 103 are exposed. Also, the pixel-defining film 110 may prevent an electric field from concentrating on end portions of the first through third pixel electrodes 101, 102, and 103 by covering the end portions of the first through third pixel electrodes 101, 102, and 103.

First through third intermediate layers 301, 302, and 303 including first through third emission layers (not shown), are respectively located on the first through third pixel electrodes 101, 102, and 103, and first through third counter electrodes 401, 402, and 403 are respectively located on the first through third intermediate layers 301, 302, and 303.

The first through third pixel electrodes 101, 102, and 103, the first through third intermediate layers 301, 302, and 303, and the first through third counter electrodes 401, 402, and 403 have island patterns. Each island pattern may be formed by patterning a certain area into an island shape so as to be distinguished from another area surrounding the certain area.

The first through third pixel electrodes 101, 102, and 103 may include a material having a reflectance higher than that of the first through third counter electrodes 401, 402, and 403. For example, light emitted by the first through third emission layers (not shown) included in the first through third intermediate layers 301, 302, and 303 may be substantially reflected by the first through third pixel electrodes 101, 102, and 103 and may be transmitted to the first through third counter electrodes 401, 402, and 403.

In an exemplary embodiment, each of the first through third pixel electrodes 101, 102, and 103 may include a reflective film formed of magnesium (Mg), aluminum (Al), platinum (Pt), palladium (Pd), gold (Au), nickel (Ni), neodymium (Nd), iridium (Ir), chromium (Cr), silver (Ag), or a combination thereof. Also, each of the first through third pixel electrodes 101, 102, and 103 may further include a transparent conductive oxide film located over or under the reflective film. In another exemplary embodiment, each of the first through third counter electrodes 401, 402, and 403 may be formed as a thin film having a thickness ranging from several to tens of micrometers (μm) by using Ag, Al, Mg, lithium (Li), calcium (Ca), copper (Cu), LiF/Ca, LiF/Al, MgAg, CaAg, or a combination thereof.

Although not shown in FIG. 1, the first through third counter electrodes 401, 402, and 403 are electrically connected to a common power supply voltage source and is supplied with a common power supply voltage, and the first through third pixel electrodes 101, 102, and 103 are supplied with driving current from driving thin-film transistors (TFTs) to allow the first through third emission layers (not shown) to emit light.

First through third passivation layers 510, 520, and 530 completely covering the first through third counter electrodes 401, 402, and 403 and having island patterns are respectively located on the first through third counter electrodes 401, 402, and 403.

The first through third passivation layers 510, 520, and 530 include first through third cover portions 511, 521, and 531 respectively covering top surfaces of the first through third counter electrodes 401, 402, and 403, and first through third protrusions 512, 522, and 532 extending from end portions of the first through third cover portions 511, 521, and 531 away from the substrate 100.

Because the first through third cover portions 511, 521, and 531 respectively completely cover the first through third counter electrodes 401, 402, and 403, the first through third cover portions 511, 521, and 531 may prevent the first through third intermediate layers 301, 302, and 303 and the first through third counter electrodes 401, 402, and 403 from deteriorating during a process.

Widths of the first through third passivation layers 510, 520, and 530 may be greater than widths of the first through third intermediate layers 301, 302 and 303 and the first through third counter electrodes 401, 402, and 403. For example, the first cover portion 511 may completely cover the first counter electrode 401 to have a first width W1 between an end portion of the first cover portion 511 and an end portion of the first counter electrode 401.

End portions of the first through third cover portions 511, 521, and 531 may directly contact a top surface of the pixel-defining film 110, and the first through third protrusions 512, 522, and 532 extending from the end portions of the first through third cover portions 511, 521, and 531 may protrude from the top surface of the pixel-defining film 110 away from the substrate 100. Accordingly, bottom surfaces of the first through third protrusions 512, 522, and 532 may directly contact the top surface of the pixel-defining film 110.

The first through third protrusions 512, 522, and 532 may have closed loop shapes respectively surrounding the first through third counter electrodes 401, 402, and 403. Each of the first through third protrusions 512, 522, and 532 may enlarge an emission area by reflecting part LS of light emitted by each of the first through third emission layers (not shown) included in the first through third intermediate layers 301, 302, and 303. For example, when the first protrusion 512 does not exist, the light LS that is emitted by the first emission layer (not shown) included in the first intermediate layer 301 to a side surface of the first sub-pixel P1 may be dispersed and may not be visible at an encapsulation member 700. In the present exemplary embodiment, however, because the light LS emitted to the side surface of the first sub-pixel P1 is reflected by the first protrusion 512 to the encapsulation member 700, an emission area may be enlarged.

Because the first through third protrusions 512, 522, and 532 of the first through third passivation layers 510, 520, and 530 function as reflective plates for reflecting side emission light and the first through third cover portions 511, 521, and 531 function as transmission windows of a top emission type display apparatus, a reflectance of the first through third passivation layers 510, 520, and 530 does not need to be high. The first through third passivation layers 510, 520, and 530 may include a material having a reflectance lower than that of the first through third pixel electrodes 101, 102, and 103. For example, the first through third passivation layers 510, 520, and 530 may include a silicon-based transparent insulating film such as silicon nitride or silicon oxide, a transparent conductive film such as indium tin oxide (ITO), indium zinc oxide (IZO), zinc oxide (ZnO), indium oxide ($In_2O_3$), indium gallium oxide (IGO), or aluminum zinc oxide (AZO), or a transparent organic material-based film.

The encapsulation member 700 may be located on the first through third passivation layers 510, 520, and 530. The encapsulation member 700 may include at least one organic layer including an organic material and at least one inorganic layer including an inorganic material. In an embodiment of the disclosure, a first inorganic layer 701, an organic layer 702, and a second inorganic layer 703 are sequentially stacked in FIG. 3. However, the inventive concepts are not limited thereto. When the first through third passivation layers 510, 520, and 530 are formed of an inorganic material, the first inorganic layer 701 may be omitted. In this case, the organic layer 702 may directly contact the first through third passivation layers 510, 520, and 530.

Each of the first inorganic layer 701 and the second inorganic layer 703 may include aluminum nitride (AlN), aluminum oxide ($Al_2O_3$), titanium nitride (TiN), titanium oxide ($TiO_2$), silicon oxynitride (SiON), silicon nitride ($SiN_x$), or silicon oxide ($SiO_x$).

Because the first inorganic layer 701 is formed along a shape of a lower structure, a top surface of the first inorganic layer 701 is not flat. The organic layer 702 covers and planarizes the first inorganic layer 701. The organic layer 702 may be formed so that a top surface of a portion corresponding to the display area DA is substantially flat.

The organic layer 702 may include polyethylene terephthalate, polyethylene naphthalate, polycarbonate, polyimide, polyethylene sulfonate, polyoxymethylene, polyarylate, hexamethyldisiloxane, an acrylic resin (e.g., polymethyl methacrylate (PMMA) or polyacrylic acid), or a combination thereof.

The second inorganic layer 703 may cover the organic layer 702 and may be deposited to directly contact the first inorganic layer 701 in the peripheral area PA of the organic light-emitting display apparatus 1, thereby preventing the organic layer 702 from being exposed to the outside of the organic light-emitting display apparatus 1.

The encapsulation member 700 may prevent damage to an organic light-emitting device (OLED) which is vulnerable to moisture along with the first through third passivation layers 510, 520, and 530 by preventing penetration of moisture.

Accordingly, according to the organic light-emitting display apparatus 1 of the present exemplary embodiment, because the first through third passivation layers 510, 520, and 530 completely cover the first through third counter electrodes 401, 402, and 403 by using a vapor deposition method having good step coverage, detects of the OLED may be reduced. Also, according to an exemplary embodiment, because the first through third protrusions 512, 522, and 532 of the first through third passivation layers 510, 520, and 530 located outside the first through third counter electrodes 401, 402, and 403 and extending away from the substrate 100 function as reflective plates for reflecting light emitted by the OLED, an emission area may be enlarged.

A method of manufacturing the organic light-emitting display apparatus 1 according to the present exemplary embodiment will now be described in detail with reference to FIGS. 4 through 8.

Figure 4:
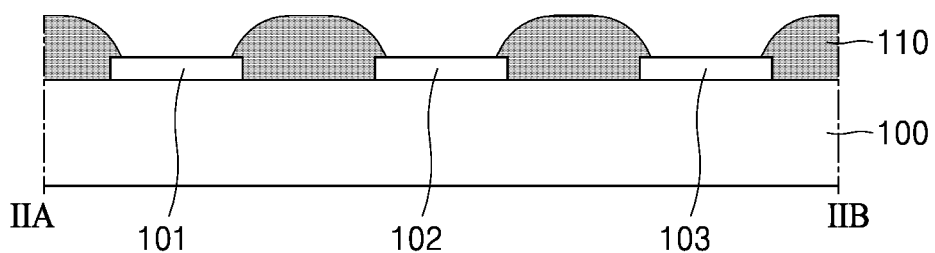
FIG. 4 is a cross-sectional view illustrating first through third pixel electrodes and a pixel-defining film on a substrate of the organic light-emitting display apparatus according to the first exemplary embodiment.

FIG. 4 is a cross-sectional view illustrating that the first through third pixel electrodes 101, 102, and 103 and the pixel-defining film 110 are formed on the substrate 100 of the organic light-emitting display apparatus 1 according to the first exemplary embodiment of the present invention. FIGS. 5A through 5G are cross-sectional views illustrating a first unit process of the organic light-emitting display apparatus 1 according to the first exemplary embodiment. FIGS. 6A through 6G are cross-sectional views illustrating a second unit process of the organic light-emitting display apparatus 1 according to the first exemplary embodiment. FIGS. 7A through 7G are cross-sectional views illustrating a third unit process of the organic light-emitting display apparatus 1 according to the first exemplary embodiment. FIG. 8 is an enlarged cross-sectional view illustrating a region VIII of FIG. 5E.

Referring to FIG. 4, the first pixel electrode 101, the second pixel electrode 102, and the third pixel electrode 103 are formed on the substrate 100.

The substrate 100 may be formed of any of various materials. For example, the substrate 100 may be formed of glass or plastic. The substrate 100 may be formed of a plastic material having excellent heat resistance and durability, such as polyimide, polyethylene naphthalate, polyethylene terephthalate, polyarylate, polycarbonate, polyetherimide, or polyethersulfone.

Although not shown in FIG. 4, a buffer layer (not shown) for planarizing a top surface of the substrate 100 and preventing penetration of impurity elements may be further formed. For example, the buffer layer (not shown) may be formed of silicon nitride and/or silicon oxide to have a single or multi-layer structure.

The first through third pixel electrodes 101, 102, and 103 may be formed by depositing a conductive material layer (not shown) by using physical vapor deposition (PVD) and then patterning the conductive material layer into island shapes. As described above, the first through third pixel electrodes 101, 102, and 103 may include a material having a high reflectance.

The pixel-defining film 110 is formed by forming an insulating (not shown) on the substrate 100 on which the first through third pixel electrodes 101, 102, and 103 are patterned into island shapes and patterning the insulating film. The pixel-defining film 110 covers end portions of the first through third pixel electrodes 101, 102, and 103.

The pixel-defining film 110 may include an organic insulating material or an inorganic insulating material. In an exemplary embodiment of the present invention, the pixel-defining film 110 may be an organic insulating film including a general purpose polymer (e.g., PMMA or polystyrene (PS)), an acryl-based polymer, an imide-based polymer, an aryl ether-based polymer, an amide-based polymer, a fluorine-based polymer, a p-xylene-based polymer, a vinyl alcohol-based polymer, or a blend thereof.

Although not shown in FIG. 4, the first through third pixel electrodes 101, 102, and 103 may be respectively electrically connected to first through third TFTs (not shown) located between the substrate 100 and the first through third pixel electrodes 101, 102, and 103.

Figure 5A:
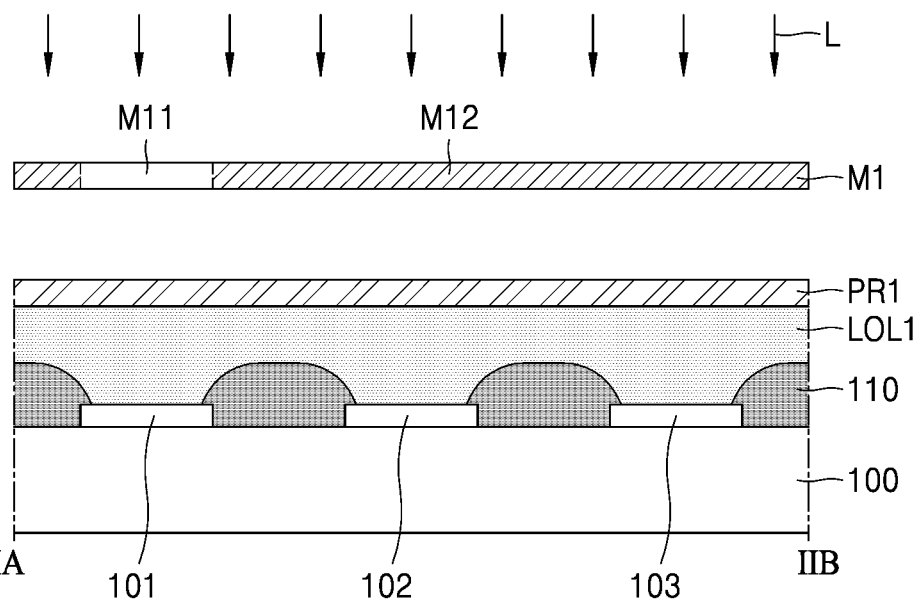
FIGS. 5A, 5B, 5C, 5D, 5E, 5F, and 5G are cross-sectional views illustrating a first unit process of the organic light-emitting display apparatus according to the first exemplary embodiment.

Referring to FIG. 5A, a first lift-off layer LOL1 and a first photoresist PR1 are sequentially formed on a structure of FIG. 4.

The first lift-off layer LOL1 may be formed of a non-photosensitive organic material. In an exemplary embodiment of the present invention, the first lift-off layer LOL1 may include a fluoropolymer. The fluoropolymer included in the first lift-off layer LOL1 may be a polymer having a fluorine content of 20 to 60 wt %. For example, the fluoropolymer may include at least one of polytetrafluoroethylene, polychlorotrtifluoroethylene, polydichlorodifluoroethylene, a copolymer of chlorotrifluoroethylene and dichlorodifluoroethylene, a copolymer of tetrafluoroethylene and perfluoroalkylvinylether, and a copolymer of chlorotrifluoroethylene and perfluoroalkylvinylether. The first lift-off layer LOL1 may be formed by using coating, printing, or deposition. However, the inventive concepts are not limited thereto, and the first lift-off layer LOL1 may include a non-fluorinated material.

The first photoresist PR1 is formed on the first lift-off layer LOL1. A portion of the first photoresist PR1 at a position corresponding to the first pixel electrode 101 is exposed through a first photomask M1 including a light transmitting portion M11 and a light blocking portion M12.

Figure 5B:
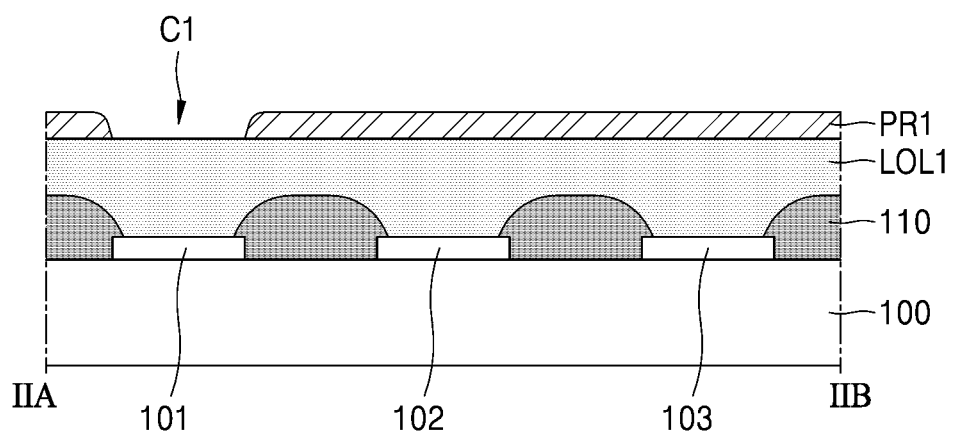

Referring to FIG. 5B, the first photoresist PR1 is developed. The first photoresist PR1 may be a positive photoresist or a negative photoresist. The present exemplary embodiment of the present invention will be described assuming that the first photoresist PR1 is a positive photoresist. The developed first photoresist PR1 has a first opening C1 at a position corresponding to the first pixel electrode 101.

Figure 5C:
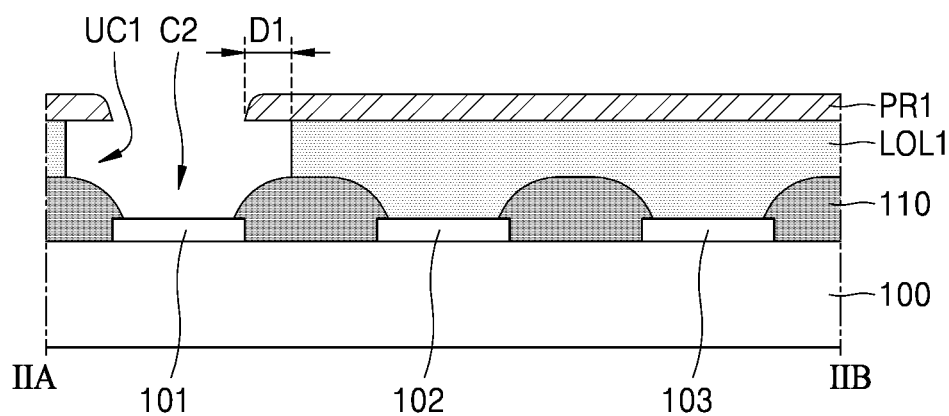

Referring to FIG. 5C, the first lift-off layer LOL1 is etched by using the first photoresist PR1 of FIG. 5B as an etch mask.

When the first lift-off layer LOL1 includes a fluoropolymer, an etching solution may use a solvent capable of etching the fluoropolymer. In this case, a first solvent may include hydrofluoroether. The hydrofluoroether is an electrochemically stable material due to its low interaction with other materials, and is an environmentally stable material due to its low global warming potential and toxicity. In another exemplary embodiment of the present invention, when the first lift-off layer LOL1 is a non-fluorinated material, a solvent having a low reactivity to a material for forming the first intermediate layer 301 and a material for forming the first counter electrode 401 and having a high reactivity to the first lift-off layer LOL1 may be selected as the first solvent.

When the first lift-off layer LOL1 is etched during an etching process using the first solvent, a first undercut profile UC1 with a first depth D1 is formed under the first opening C1 of the first photoresist PR1, and a second opening C2 through which a top surface of the first pixel electrode 101 and a part of the pixel-defining film 110 are exposed is formed. Because the first undercut profile UC1 with the first depth D1 is formed, a wider deposition space over the first pixel electrode 101 may be secured.

Figure 5D:
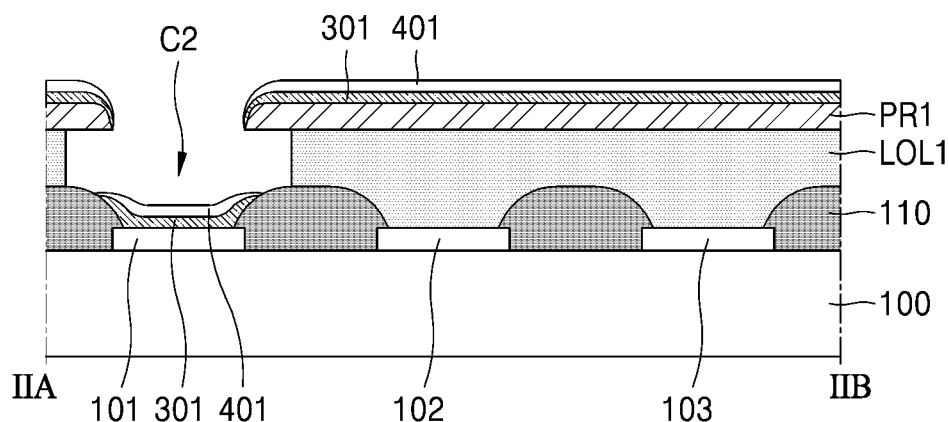

Referring to FIG. 5D, the first intermediate layer 301 including the first emission layer (not shown) and the first counter electrode 401 are formed on a structure of FIG. 5C.

The first intermediate layer 301 and the first counter electrode 401 are formed by using vacuum deposition. For example, the first intermediate layer 301 and the first counter electrode 401 may be deposited by using PVD. In an exemplary embodiment of the invention, the first intermediate layer 301 may be deposited by using one of sputtering, thermal evaporation, electron (E)-beam evaporation, laser molecular-beam epitaxy, and pulsed laser deposition. The first counter electrode 401 is formed to cover the first intermediate layer 301 by adjusting a deposition angle of incidence, a chamber pressure, a temperature, a reactive gas, etc.

Because the first lift-off layer LOL1 having the second opening C2 and the first photoresist PR1 function as masks, the first intermediate layer 301 and the first counter electrode 401 may be deposited to have island shapes.

The first intermediate layer 301 may include the first emission layer (not shown) and may further include at least one of a hole injection layer, a hole transport layer, an electron transport layer, and an electron injection layer.

The first counter electrode 401 may be formed of a material having a reflectance lower than that of the first pixel electrode 101 as described above. Because the first counter electrode 401 is formed to cover the first intermediate layer 301, the first counter electrode 401 may function as a protective film for protecting the first intermediate layer 301 that is vulnerable to moisture and oxygen.

The first intermediate layer 301 and the first counter electrode 401 are deposited on the top surface of the first pixel electrode 101 in the second opening C2, on a top surface of the part of the pixel-defining film 110, and on the first photoresist PR1.

Figure 5E:
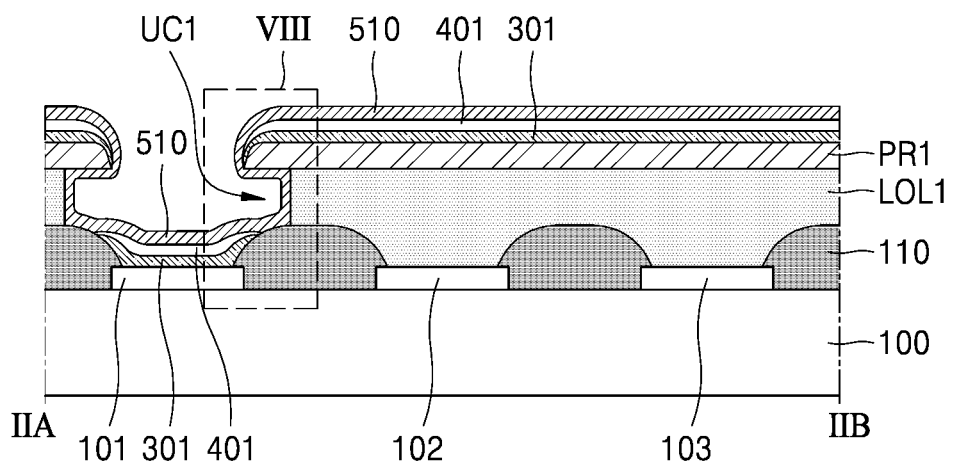

Referring to FIG. 5E, the first passivation layer 510 is formed on a structure of FIG. 5D.

The first passivation layer 510 is formed to completely cover a top surface and an end portion of the first counter electrode 401. The first passivation layer 510 may be deposited by using chemical vapor deposition (CVD) or atomic layer deposition (ALD) having better step coverage than PVD. In an exemplary embodiment of the present invention, the first passivation layer 510 may be deposited by using one of thermal CAD, plasma CVD, metal-organic CVD (MOCVD), and hydride vapor phase epitaxy (HVPE).

Referring to FIG. 8, which is an enlarged view illustrating a region VIII of FIG. 5E, as a result of the CVD or ALD, the first passivation layer 510 is deposited not only on an upper portion R1 of the first photoresist PR1, a top surface R5 of the first counter electrode 401, and a top surface R4 of the pixel-defining film 110 in the second opening C2, but also on a bottom surface R2 of the first photoresist PR1 and a side surface R3 of the first lift-off layer LOL1 in the first undercut profile UC1.

Figure 5F:
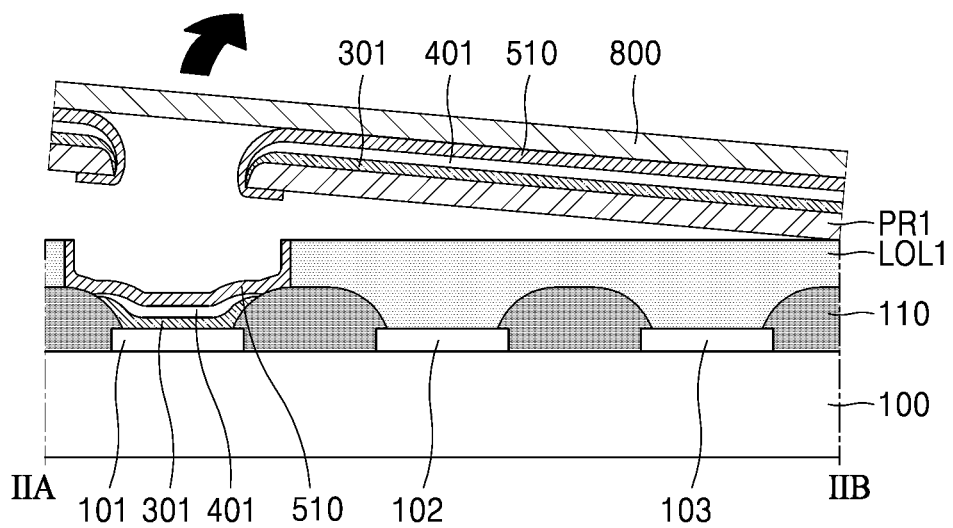

Referring to FIG. 5F, after a dry film 800 is attached to a structure of FIG. 5E, the first photoresist PR1, which remains, is removed by applying an external force. In this case, the first intermediate layer 301, the first counter electrode 401, and the first passivation layer 510 deposited on the first photoresist PR1 and the first passivation layer 510 deposited on the bottom surface R2 of the first photoresist PR1 are also removed along with the first photoresist PR1.

Figure 5G:
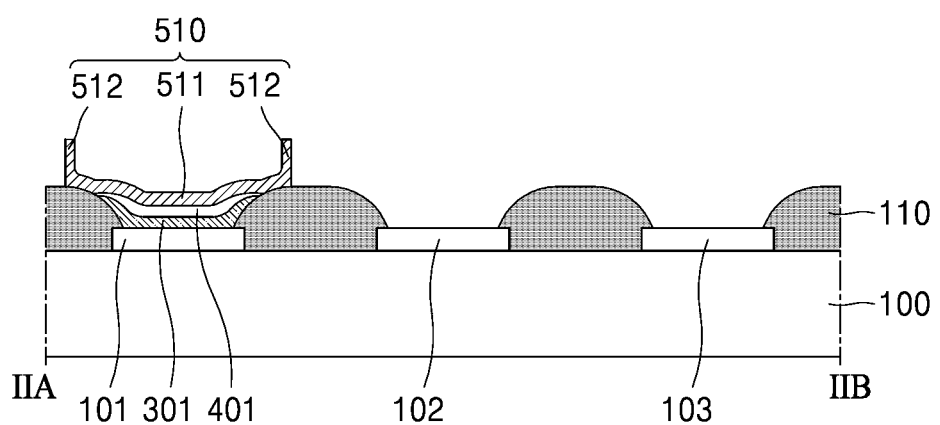

Referring to FIG. 5G, the first lift-off layer LOL1 remaining after the first photoresist PR1 is removed in FIG. 5F is removed by being dissolved with a solvent.

When the first lift-off layer LOL1 includes a fluoropolymer, the first lift-off layer LOL1 may be removed by using a second solvent including fluorine. Because a lift-off process is performed after the first intermediate layer 301 including the first emission layer (not shown) is formed, it is preferable that a material having a low reactivity to the first intermediate layer 301 is used as the second solvent.

The second solvent may include hydrofluoroether, like the first solvent. When the first lift-off layer LOL1 is a non-fluorinated material, a solvent having a low reactivity to a material for forming the first intermediate layer 301 and a material for forming the first counter electrode 401 and a high reactivity to the first lift-off layer LOL1 may be selected as the second solvent.

As the first lift-off layer LOL1 is dissolved with the solvent, the first intermediate layer 301, the first counter electrode 401, and the first passivation layer 510 located on the first pixel electrode 101 remain as patterns. In this case, the pattern of the first passivation layer 510 includes the cover portion 511 covering the top surface of the first counter electrode 401 and the protrusion 512 deposited on the side surface R3 (see FIG. 8) of the first lift-off layer LOL1.

A second unit process will now be described. The same description as that of the first unit process will not be repeated.

Figure 6A:
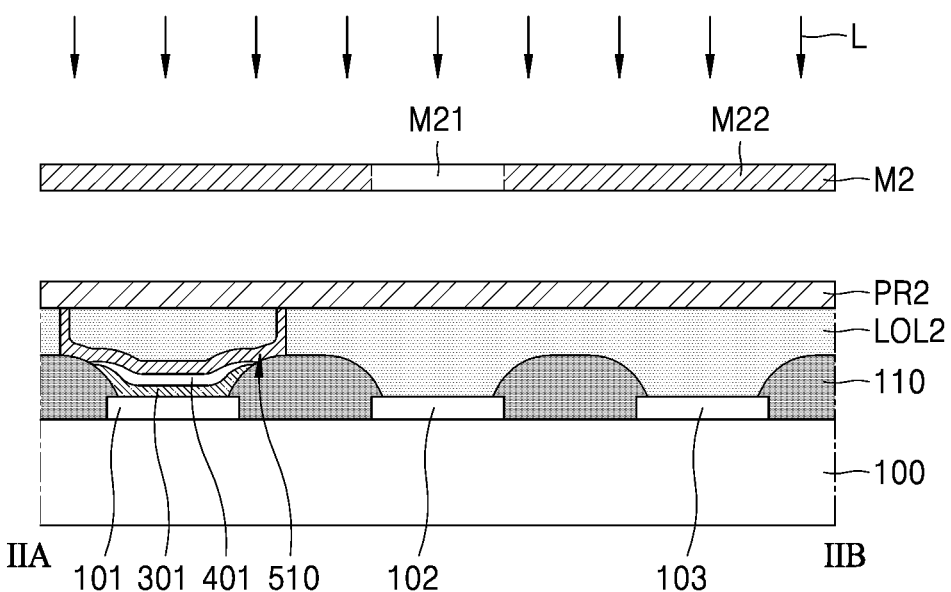
FIGS. 6A, 6B, 6C, 6D, 6E, 6F, and 6G are cross-sectional views illustrating a second unit process of the organic light-emitting display apparatus according to the first exemplary embodiment.

Referring to FIG. 6A, a second lift-off layer LOL2 and a second photoresist PR2 are sequentially formed on a structure of FIG. 5G.

The second lift-off layer LOL2 may be formed of the same material as that of the first lift-off layer LOL1. The second lift-off layer LOL2 may be formed by using coating, printing, or deposition.

The second photoresist PR2 is formed on the second lift-off layer LOL2. A portion of the second photoresist PR2 at a position corresponding to the second pixel electrode 102 is exposed through a second photomask M2 including a light transmitting portion M21 and a light blocking portion M22.

Figure 6B:
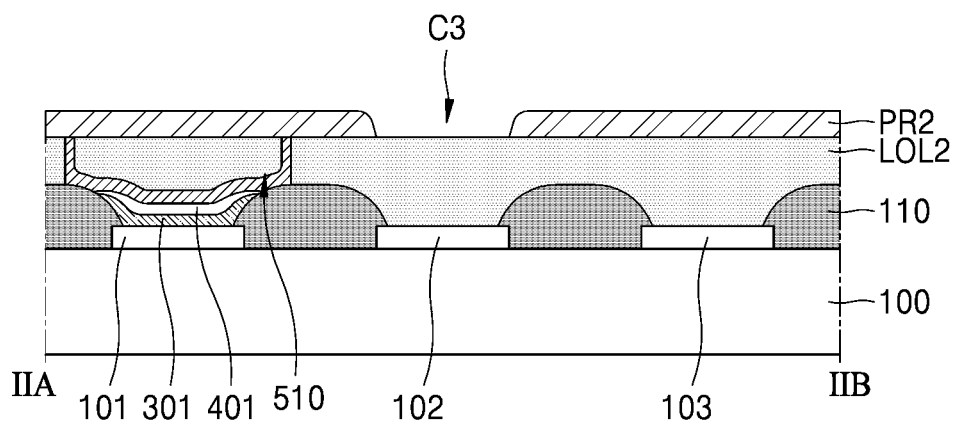

Referring to FIG. 6B, the second photoresist PR2 is developed. The developed second photoresist PR2 has a third opening C3 at a position corresponding to the second pixel electrode 102.

Figure 6C:
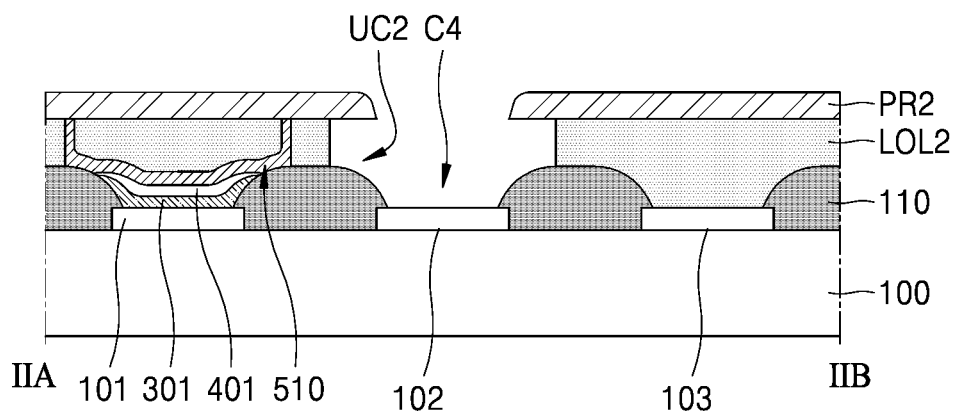

Referring to FIG. 6C, the second lift-off layer LOL2 is etched by using the second photoresist PR2 of FIG. 6B as an etch mask.

When the second lift-off layer LOL2 includes a fluoropolymer, an etching solution uses a solvent capable of etching the fluoropolymer. A first solvent may include hydrofluoroether.

When the second lift-off layer LOL2 is etched during an etching process using the first solvent including fluorine, a second undercut profile UC2 is formed under the third opening C3 of the second photoresist PR2, and a fourth opening C4 is formed through which a top surface of the second pixel electrode 102 and a part of the pixel-defining film 110 are exposed. Because the second undercut profile UC2 is formed, a wider deposition space over the second pixel electrode 102 may be secured.

Figure 6D:
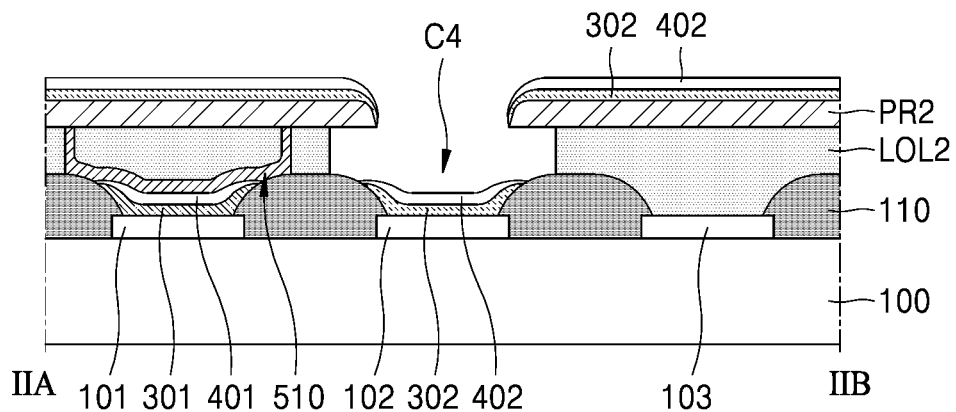

Referring to FIG. 6D, the second intermediate layer 302, including the second emission layer (not shown) and the second counter electrode 402, are formed on a structure of FIG. 6C.

The second intermediate layer 302 and the second counter electrode 402 are formed by using vapor deposition. For example, the second intermediate layer 302 and the second counter electrode 402 may be deposited by using PVD.

The second intermediate layer 302 and the second counter electrode 402 are deposited on the top surface of the second pixel electrode 102 in the fourth opening C4, on a top surface of the part of the pixel-defining film 110, and on the second photoresist PR2. Because the second lift-off layer LOL2 having the fourth opening C4 and the second photoresist PR2 function as masks, the second intermediate layer 302 and the second counter electrode 402 may be deposited on the substrate 100 to have island shapes.

The second intermediate layer 302 may include the second emission layer (not shown) and may further include at least one of a hole injection layer, a hole transport layer, an electron transport layer, and an electron injection layer.

The second counter electrode 402 may be formed of a material having a reflectance lower than that of the second pixel electrode 102 as described above. Because the second counter electrode 402 is formed to cover the second intermediate layer 302, the second counter electrode 402 may function as a protective film for protecting the second intermediate layer 302 that is vulnerable to moisture and oxygen.

Figure 6E:
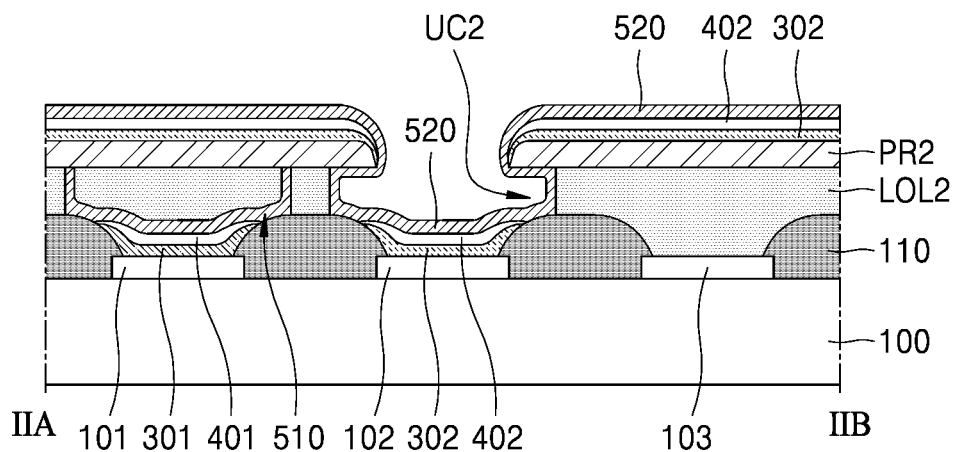

Referring to FIG. 6E, the second passivation layer 520 is formed on a structure of FIG. 6D.

The second passivation layer 520 is formed to completely cover a top surface and an end portion of the second counter electrode 402. The second passivation layer 520 may be deposited by using CND or ALD having better step coverage than PVD. Accordingly, the second passivation layer 520 is deposited not only on the second photoresist PR2, a top surface of the second counter electrode 402 in the fourth opening C4, and a top surface of the pixel-defining film 110 but also on a bottom surface of the second photoresist PR2 and a side surface of the second lift-off layer LOL2 in the second undercut profile UC2.

Figure 6F:
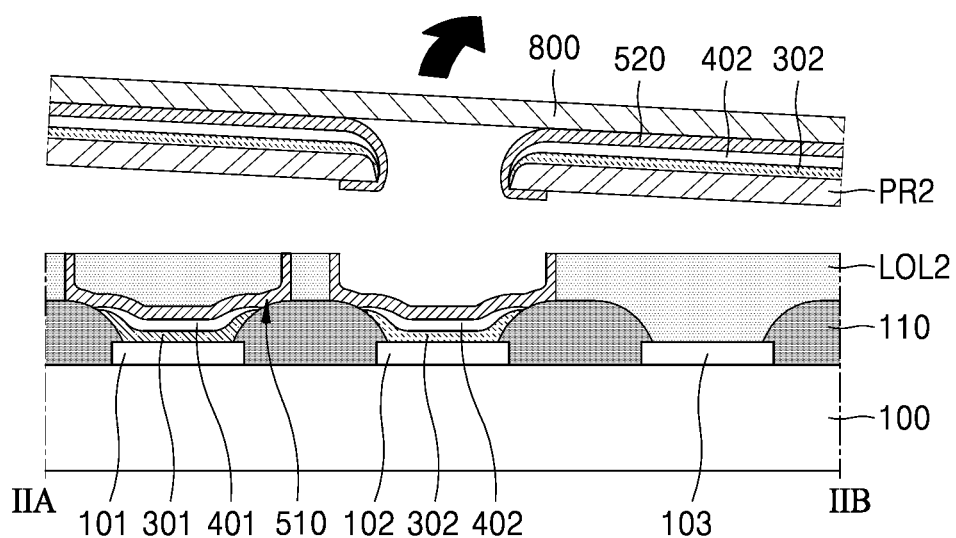

Referring to FIG. 6F, after the dry film 800 is attached to a structure of FIG. 6E, the second photoresist PR2, which remains, is removed by applying an external force. In this case, the second intermediate layer 302, the second counter electrode 402, and the second passivation layer 520 deposited on the second photoresist PR2 and the second passivation layer 520 deposited on the bottom surface of the second photoresist PR2 are also removed along with the second photoresist PR2.

Figure 6G:
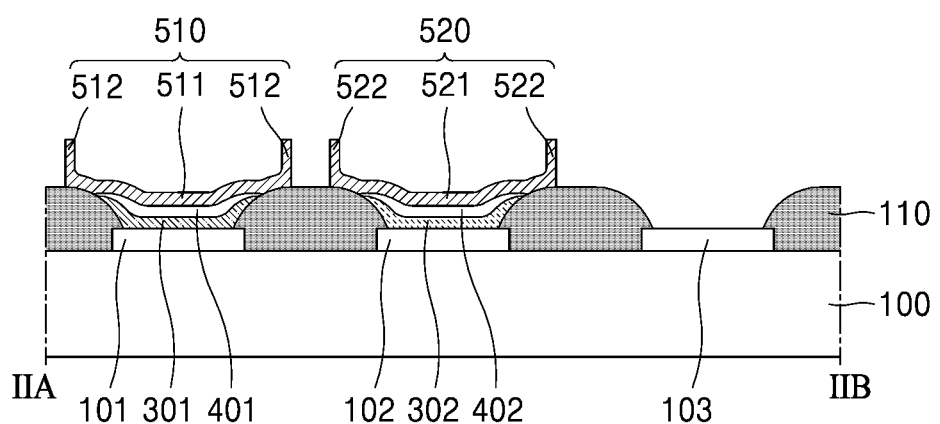

Referring to FIG. 6G, the second lift-off layer LOL2 remaining after the second photoresist PR2 is removed in FIG. 6F is removed by being dissolved with a solvent.

As the second lift-off layer LOL2 is dissolved with the solvent, the second intermediate layer 302, the second counter electrode 402, and the second passivation layer 520 located on the second pixel electrode 102 remain as patterns. In this case, the pattern of the second passivation layer 520 includes the cover portion 521 covering the top surface of the second counter electrode 402 and the protrusion 522 deposited on the side surface of the second lift-off layer LOL2.

A third unit process will now be described. The same description as that of the first and second unit processes will not be repeated.

Figure 7A:
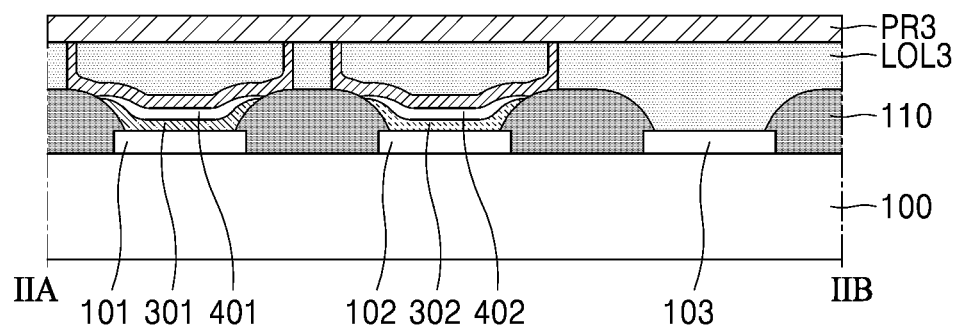
FIGS. 7A, 7B, 7C, 7D, 7E, 7F, and 7G are cross-sectional views illustrating a third unit process of the organic light-emitting display apparatus according to the first exemplary embodiment.
Figure 8:
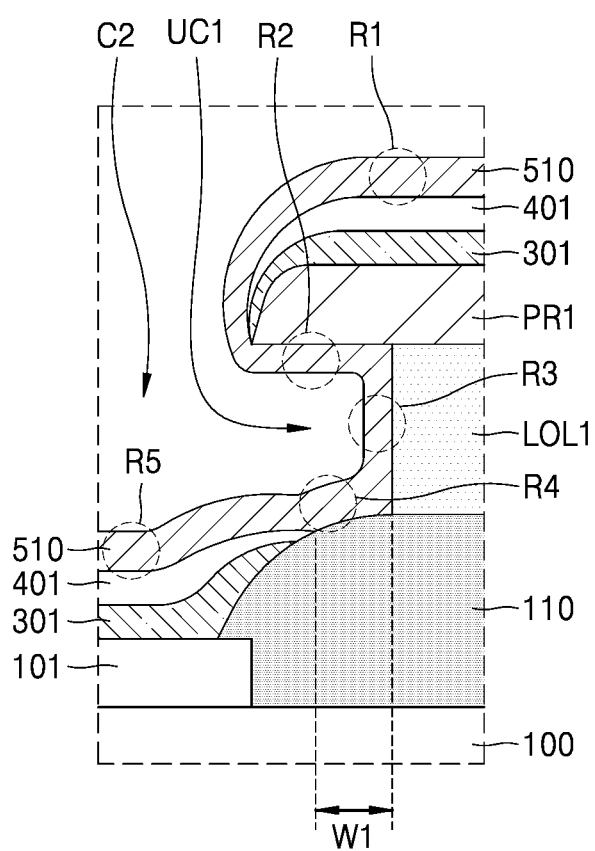
FIG. 8 is an enlarged cross-sectional view illustrating a region VIII of FIG. 5E.

Referring to FIG. 7A, a third lift-off layer LOL3 and a third photoresist PR3 are sequentially formed on a structure of FIG. 6G.

The third lift-off layer LOL3 may be formed of the same material as that of the first and second lift-off layers LOL1 and LOL2. The third lift-off layer LOL3 may be formed by using coating, printing, or deposition.

The third photoresist PR3 is formed on the third lift-off layer LOL3. The third photoresist PR3 of a position corresponding to the third pixel electrode 103 is exposed through a third photomask M3 including a light transmitting portion M31 and a light blocking portion M32.

Figure 7B:
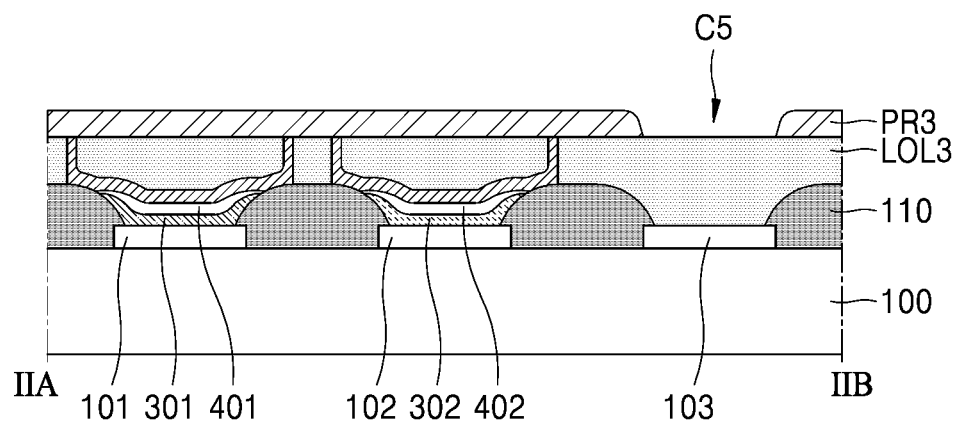

Referring to FIG. 7B, the third photoresist PR3 is developed. The third photoresist PR3 has a fifth opening C5 at a position corresponding to the third pixel electrode 103.

Figure 7C:
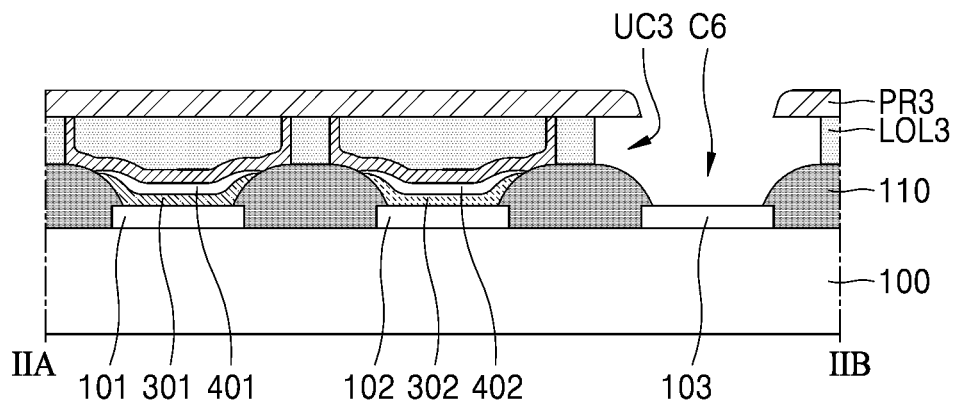

Referring to FIG. 7C, the third lift-off layer LOL3 is etched by using the third photoresist PR3 of FIG. 7B as an etch mask.

When the third lift-off layer LOL3 includes a fluoropolymer, an etching solution uses a solvent capable of etching the fluoropolymer. A first solvent may include hydrofluoroether.

When the third lift-off layer LOL3 is etched during an etching process using the first solvent including fluorine, a third undercut profile UC3 is formed under the fifth opening C5 of the third photoresist PR3, and a sixth opening C6 through which a top surface of the third pixel electrode 103 and a part of the pixel-defining film 110 are exposed is formed. Because the third undercut profile UC3 is formed, a wider deposition space over the third pixel electrode 103 may be secured.

Figure 7D:
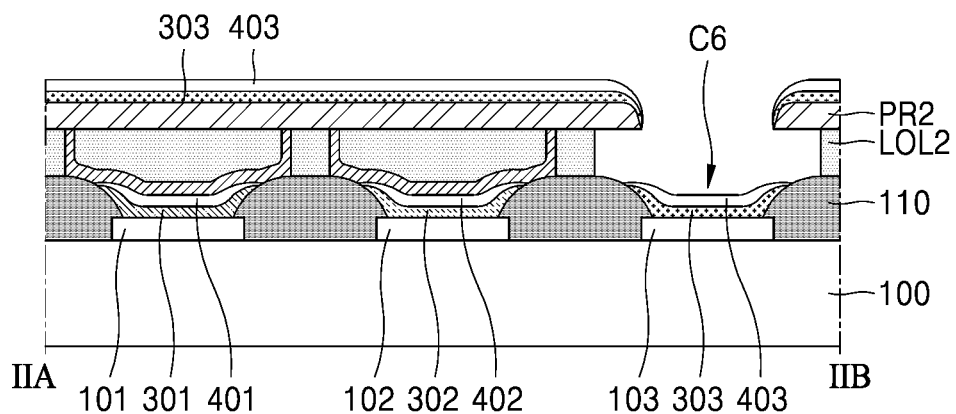

Referring to FIG. 7D, the third intermediate layer 303 including the third emission layer (not shown) and the third counter electrode 403 are formed on a structure of FIG. 7C.

The third intermediate layer 303 and the third counter electrode 403 are formed by using vacuum deposition. For example, the third intermediate layer 303 and the third counter electrode 403 may be deposited by using PVD.

The third intermediate layer 303 and the third counter electrode 403 are deposited on the top surface of the third pixel electrode 103 in the sixth opening C6, on a top surface of the part of the pixel-defining film 110, and on the third photoresist PR3. Because the third lift-off layer LOL3 having the sixth opening C6 and the third photoresist PR3 function as masks, the third intermediate layer 303 and the third counter electrode 403 may be deposited on the substrate 100 to have island shapes.

The third intermediate layer 303 may include the third emission layer (not shown) and may further include at least one of a hole injection layer, a hole transport layer, an electron transport layer, and an electron injection layer.

The third counter electrode 403 may be formed of a material having a reflectance lower than that of the third pixel electrode 103 as described above. Because the third counter electrode 403 is formed to cover the third intermediate layer 303, the third counter electrode 403 may function as a protective film for protecting the third intermediate layer 303 that is vulnerable to moisture and oxygen.

Figure 7E:
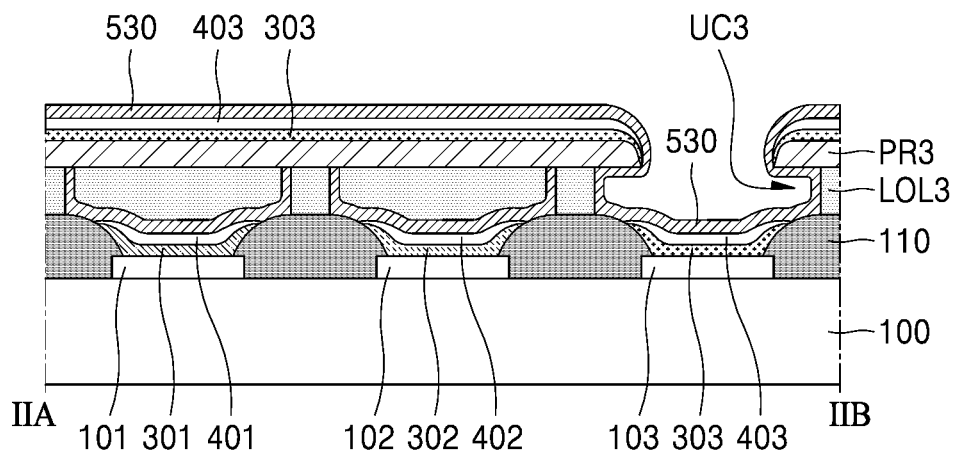

Referring to FIG. 7E, the third passivation layer 530 is formed on a structure of FIG. 7D.

The third passivation layer 530 is formed to completely cover a top surface and an end portion of the third counter electrode 403. The third passivation layer 530 may be deposited by using CVD or ALD having better step coverage than PVD. Accordingly, the third passivation layer 530 is deposited not only on the third photoresist PR3, a top surface of the third counter electrode 403 in the sixth opening C6, and a top surface of the pixel-defining film 110 but also on a bottom surface of the third photoresist PR3 and a side surface of the third lift-off layer LOL3 in the third undercut profile UC3.

Figure 7F:
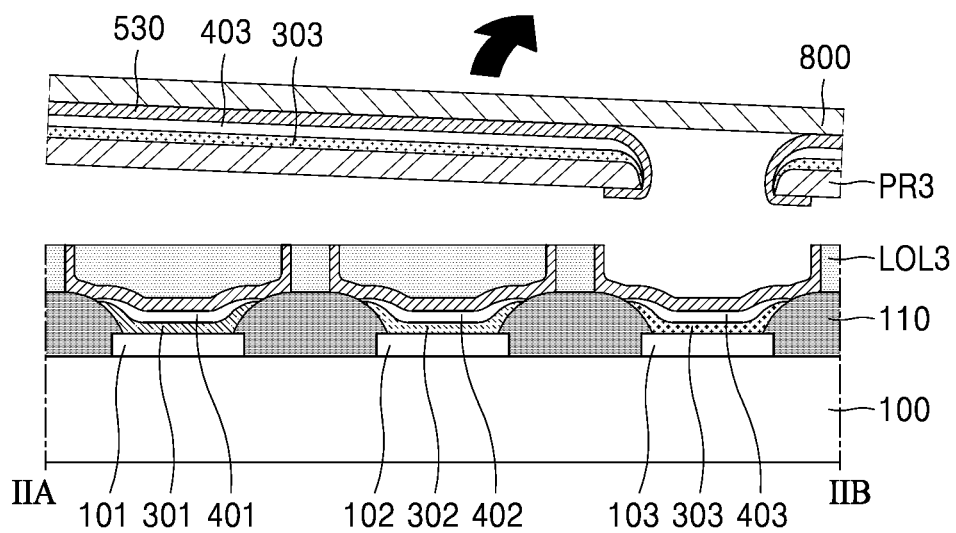

Referring to FIG. 7F, after the dry film 800 is attached to a structure of FIG. 7E, the third photoresist PR3, which remains, is removed by applying an external force. In this case, the third intermediate layer 303, the third counter electrode 403, and the third passivation layer 530 deposited on the third photoresist PR3 and the third passivation layer 530 deposited on the bottom surface of the third photoresist PR3 are also removed along with the third photoresist PR3.

Figure 7G:
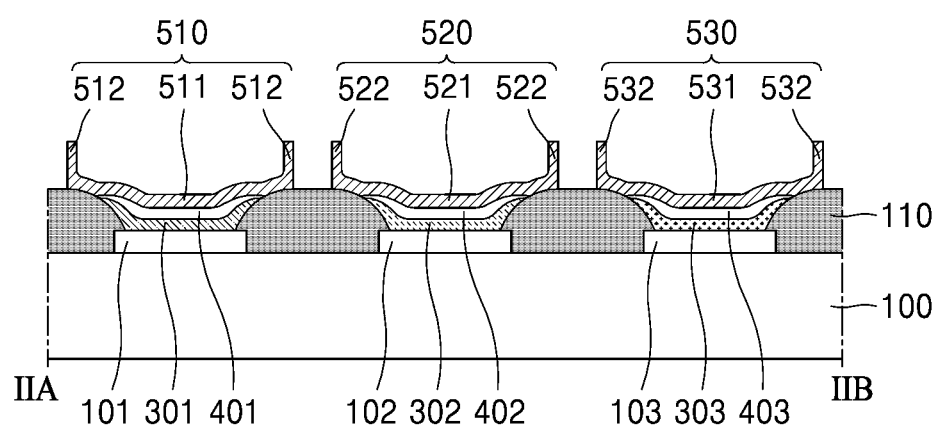

Referring to FIG. 7G, the third lift-off layer LOL3 remaining after the third photoresist PR3 is removed in FIG. 7F is removed by being dissolved with a solvent.

As the third lift-off layer LOL3 is dissolved with the solvent, the third intermediate layer 303, the third counter electrode 403, and the third passivation layer 530 located on the third pixel electrode 103 remain as patterns. In this case, the pattern of the third passivation layer 530 includes the cover portion 531 covering the top surface of the third counter electrode 403 and the protrusion 532 deposited on the side surface of the third lift-off layer LOL3.

After the first through third unit processes are performed, the encapsulation member 700 (see FIG. 1) covering top surfaces of the first through third passivation layers 510, 520, and 530 is located.

The encapsulation member 700 may include at least one organic layer and at least one inorganic layer. In FIG. 3, the first inorganic layer 701, the organic layer 702, and the second inorganic layer 703 are sequentially stacked. The encapsulation member 700 may prevent damage to an OLED that is vulnerable to moisture along with the first through third passivation layers 510, 520, and 530 by preventing penetration of moisture.

According to a manufacturing method according to the present exemplary embodiment, because an intermediate layer including an emission layer is formed by using a lift-off process instead of a deposition process using a fine metal mask (FMM), misalignment of the FMM may be prevented and manufacturing costs may be reduced. Also, because a passivation layer is formed by using a vapor deposition method having good step coverage to completely cover a counter electrode, defects of an OLED may be reduced. Also, because a protrusion of the passivation layer located outside the counter electrode and extending away from a substrate functions as a reflective plate for reflecting light emitted by the OLED, an emission area may be enlarged.

Another method of manufacturing the organic light-emitting display apparatus 1 according to an exemplary embodiment of the present invention will now be described with reference to FIGS. 9A and 9B.

Figure 9A:
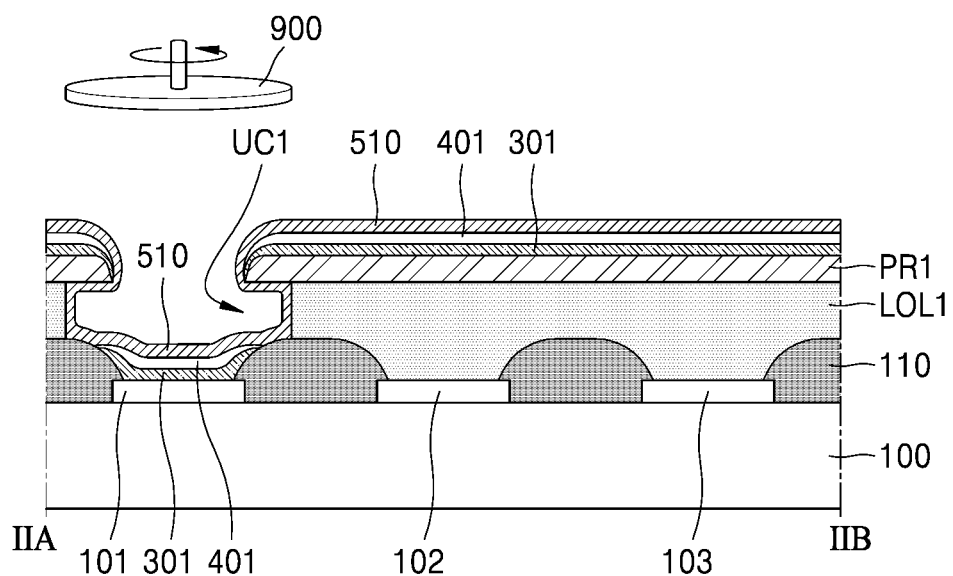
FIGS. 9A and 9B are views illustrating a part of a first unit process of manufacturing the organic light-emitting display apparatus by using chemical mechanical polishing (CMP).
Figure 9B:
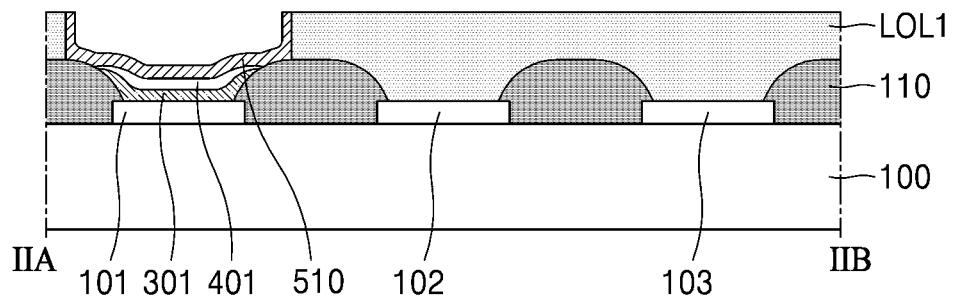

FIGS. 9A and 9B are views illustrating a part of a first unit process of manufacturing the organic light-emitting display apparatus 1 by using chemical mechanical polishing (CMP). The following will focus on a difference from FIGS. 5A through 5G illustrating a first unit process of a manufacturing method.

Referring to FIG. 9A, as the same process as a process of FIGS. 5A through 5G is performed, the first through third pixel electrodes 101, 102, and 103 are located on the substrate 100 to be spaced apart from one another, and the pixel-defining film 110 covers end portions of the first through third pixel electrodes 101, 102, and 103.

The first intermediate layer 301, the first counter electrode 401, and the first passivation layer 510 are sequentially deposited on the first pixel electrode 101 and the first photoresist PR1. The first passivation layer 510 is deposited, by using CND or ALD having good step coverage, on a bottom surface of the first photoresist PR1 and a side surface of the first lift-off layer LOL1 in the first undercut profile UC1.

In this case, when compared with FIG. 5, in the present exemplary embodiment, the first photoresist PR1, which remains, is polished and removed by using CMP instead of the dry film 800. For example, the first photoresist PR1 may be polished by using a polishing pad 900 of FIG. 9A. Although not shown in FIG. 9A, slurry may be further supplied between the polishing pad 900 and the first photoresist PR1. When compared with peeling using the dry film 800, a surface of a polished upper portion may be planarized.

Referring to FIG. 9B, the first lift-off layer LOL1 remaining after the first photoresist PR1 is removed in FIG. 9A is removed by being dissolved with a solvent. A process of dissolving the first lift-off layer LOL1 with the solvent is the same as that of FIG. 5G. As the first lift-off layer LOL1 is dissolved with the solvent, the first intermediate layer 301, the first counter electrode 401, and the first passivation layer 510 located on the first pixel electrode 101 remain as patterns.

An organic light-emitting display apparatus 2 and a method of manufacturing the same according to a second exemplary embodiment of the present invention will now be described with reference to FIGS. 10 through 11C.

Figure 10:
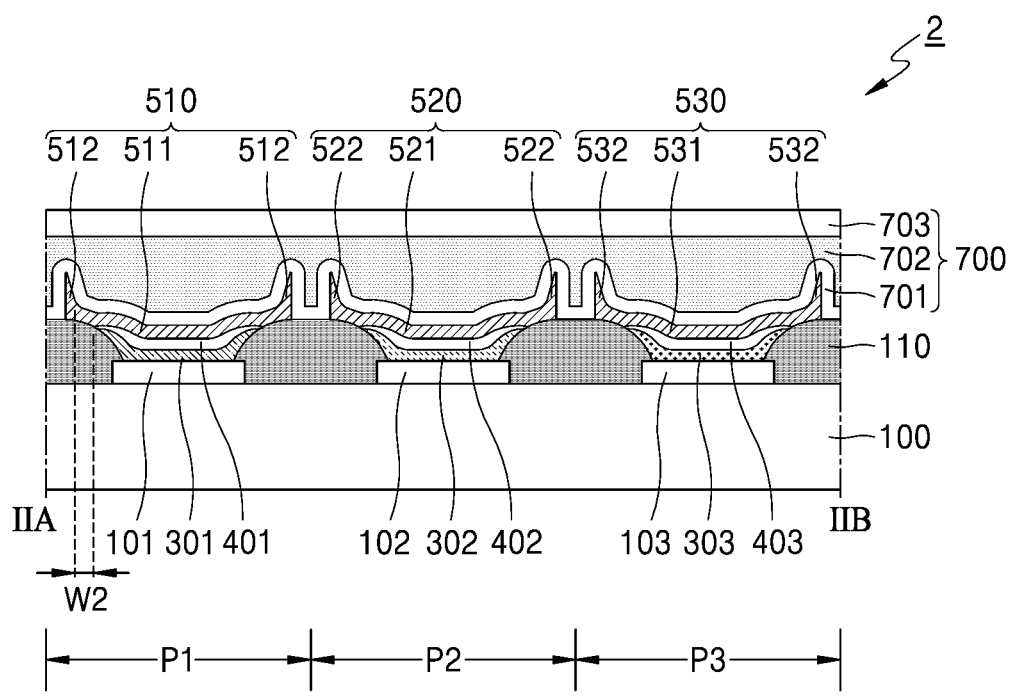
FIG. 10 is a cross-sectional view of an organic light-emitting display apparatus according to a second exemplary embodiment of the present invention.
Figure 11A:
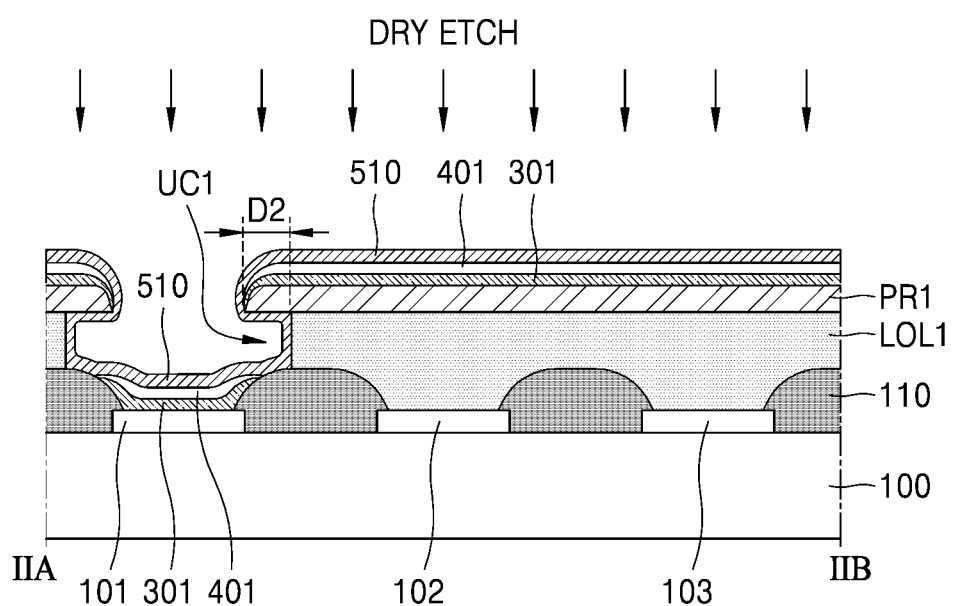
FIGS. 11A, 11B, and 11C are cross-sectional views illustrating a part of a first unit process of the organic light-emitting display apparatus according to the second exemplary embodiment.
Figure 11B:
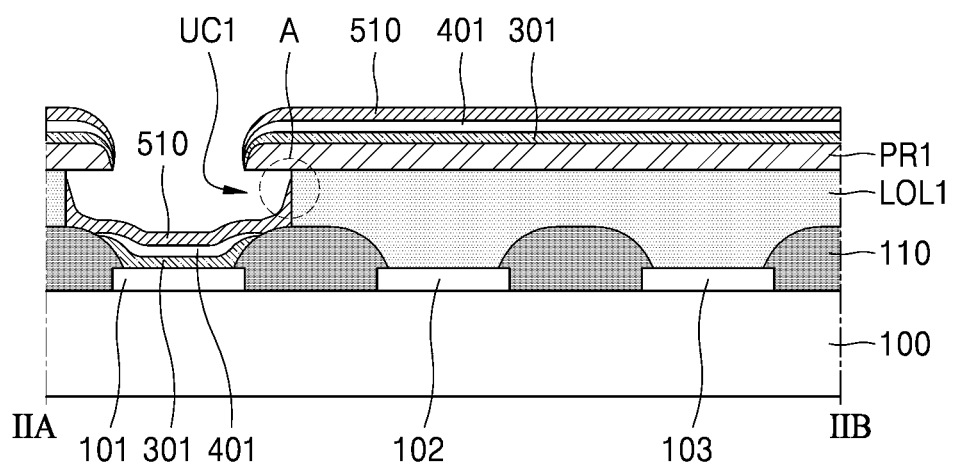

FIG. 10 is a cross-sectional view of the organic light-emitting display apparatus 2 according to the second exemplary embodiment. FIGS. 11A through 11C are cross-sectional views illustrating a part of a first unit process of the organic light-emitting display apparatus 2 according to the second exemplary embodiment.

Referring to FIG. 10, in the organic light-emitting display apparatus 2 according to the second exemplary embodiment, a plurality of pixel electrodes including the first pixel electrode 101, the second pixel electrode 102, and the third pixel electrode 103 are located on the substrate 100 to be spaced apart from one another, and the pixel-defining film 110 covers end portions of the first through third pixel electrodes 101, 102, and 103.

The first through third intermediate layers 301, 302, and 303, including the first through third emission layers (not shown) are respectively located on the first through third pixel electrodes 101, 102, and 103, and the first through third counter electrodes 401, 402, and 403 are respectively located on the first through third intermediate layers 301, 302, and 303. The first through third passivation layers 510, 520, and 530 are located on the first through third counter electrodes 401, 402, and 403.

The first through third pixel electrodes 101, 102, and 103, the first through third intermediate layers 301, 302, and 303, the first through third counter electrodes 401, 402, and 403, and the first through third passivation layers 510, 520, and 530 have island patterns, as in the previously-described exemplary embodiments.

The first through third passivation layers 510, 520, and 530 include the first through third cover portions 511, 521, and 531 covering top surfaces of the first through third counter electrodes 401, 402, and 403 and the first through third protrusions 512, 522, and 532 respectively extending from the first through third cover portions 511, 521, and 531. In the present exemplary embodiment, the first through third protrusions 512, 522, and 532 have widths decreasing away from the substrate 100.

Widths of the first through third passivation layers 510, 520, and 530 may be greater than widths of the first through third intermediate layers 301, 302, and 303 and the first through third counter electrodes 401, 402, and 403. For example, the first cover portion 511 may completely cover the first counter electrode 401 to have a second width W2 between an end portion of the first cover portion 511 and an end portion of the first counter electrode 401.

The encapsulation member 700 is located covering top surfaces of the first through third passivation layers 510, 520, and 530. The encapsulation member 700 may include at least one organic layer and at least one inorganic layer. FIG. 10 illustrates a structure in which the first inorganic layer 701, the organic layer 702, and the second inorganic layer 703 are sequentially stacked.

Referring to FIG. 11A, as the same process as a process of FIGS. 5A through 5E is performed, the first through third pixel electrodes 101, 102, and 103 are located on the substrate 100 to be spaced apart from one another, and the pixel-defining film 110 covers end portions of the first through third pixel electrodes 101, 102, and 103.

The first intermediate layer 301, the first counter electrode 401, and the first passivation layer 510 are sequentially deposited on the first pixel electrode 101 and the first photoresist PR1. Because the first undercut profile UC1 with a second depth D2 is formed, a wider deposition space over the first pixel electrode 101 may be secured. The second depth D2 of the first undercut profile UC1 may be designed to be the same as the first depth D1 of the first undercut profile UC1 of FIG. 5C.

The first passivation layer 510 is deposited, by using CVD or ALD having good step coverage, on a bottom surface of the first photoresist PR1 and a side surface of the first lift-off layer LOL1 in the first undercut profile UC1.

In this case, when compared with FIG. 5F, in the present exemplary embodiment, dry etching, instead of mechanical exfoliation using the dry film 800, is performed.

Referring to FIG. 11B, as a result of the dry etching, in an area A where the first undercut profile UC1 is formed, the first passivation layer 501 formed on the bottom surface of the first photoresist PR1 is almost removed and the first passivation layer 501 formed on the side surface of the first lift-off layer LOL1 is etched to have a width decreasing away from the substrate 100.

The present exemplary embodiment is not limited to the dry etching, and wet etching may be performed as long as the wet etching is anisotropic etching.

Figure 11C:
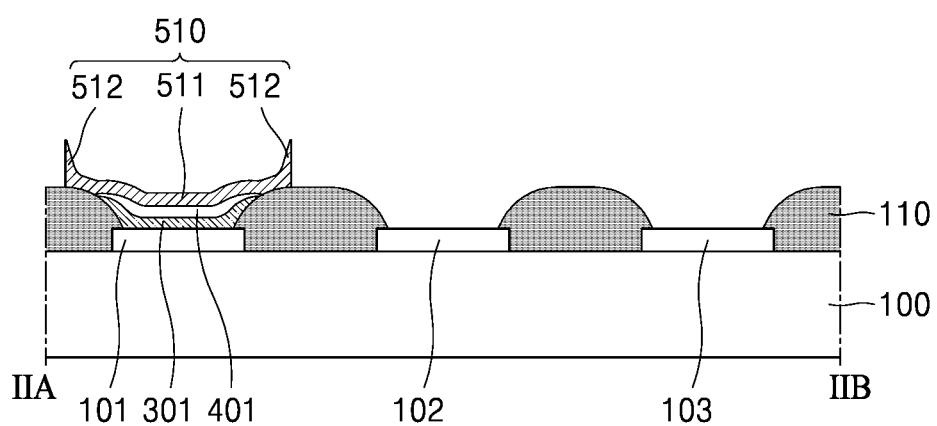

Referring to FIG. 11C, a lift-off process is performed on a structure of FIG. 11B. Although a process of dissolving the first lift-off layer LOL1 with a solvent is performed in FIG. 5G, the first lift-off layer LOL1, which remains, is removed by using the lift-off process in the present exemplary embodiment.

As the first lift-off layer LOL1 is removed by using the lift-off process, the first photoresist PR1 located on the first lift-off layer LOL1 and the first intermediate layer 301, the first counter electrode 401, and the first passivation layer 510 remaining on the first photoresist PR1 are also removed along with the first lift-off layer LOL1. The lift-off process may be performed outside a chamber, thereby simplifying a process.

When the first lift-off layer LOL1 includes a fluoropolymer, the first lift-off layer LOL1 may be removed by using a second solvent including fluorine. Because the lift-off process is performed after the first intermediate layer 301 including the first emission layer (not shown) is formed, it is preferable that a material having a low reactivity to the first intermediate layer 301 is used as the second solvent. The second solvent may include hydrofluoroether, like a first solvent.

As a result of the lift-off process, the first intermediate layer 301, the first counter electrode 401, and the first passivation layer 501 located on the first pixel electrode 101 remain as patterns. In particular, the first passivation layer 510 includes the first cover portion 511 covering a top surface of the first counter electrode 401 and the first protrusion 52 extending from the first cover portion 511 and having a width decreasing away from the substrate 100.

An organic light-emitting display apparatus 3 and a method of manufacturing the same according to a third exemplary embodiment of the present invention will now be described with reference to FIGS. 12 through 13C.

Figure 12:
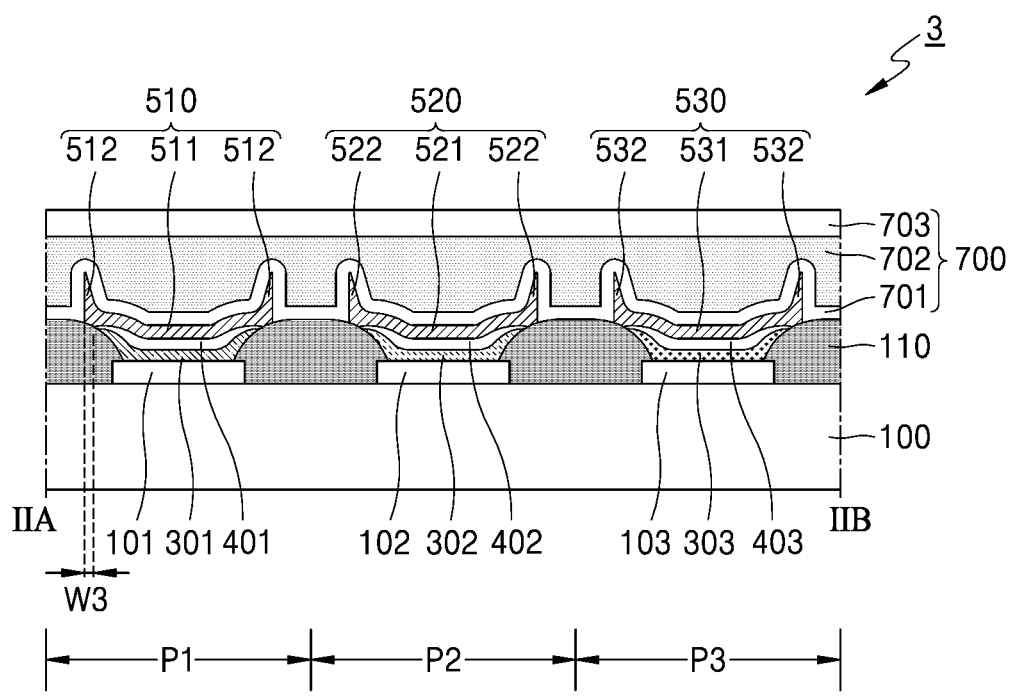
FIG. 12 is a cross-sectional view of an organic light-emitting display apparatus according to a third exemplary embodiment of the present invention.
Figure 13A:
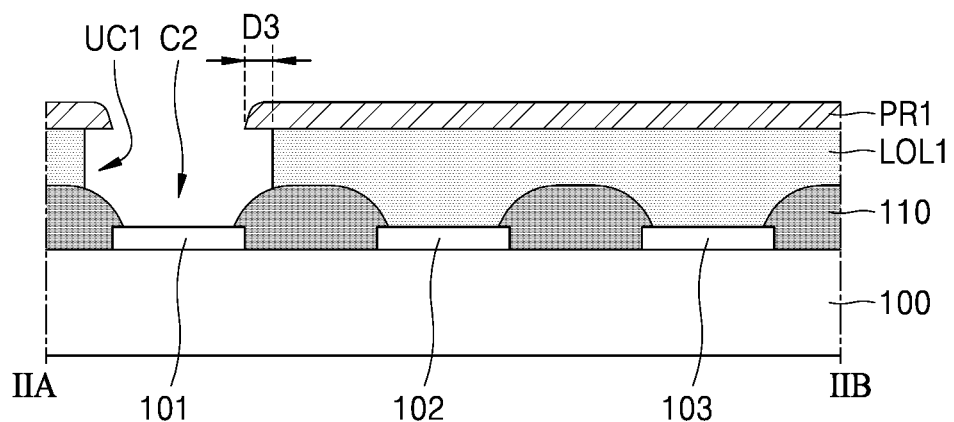
FIGS. 13A, 13B, and 13C are cross-sectional views illustrating a part of a first unit process of the organic light-emitting display apparatus according to the third exemplary embodiment.
Figure 13B:
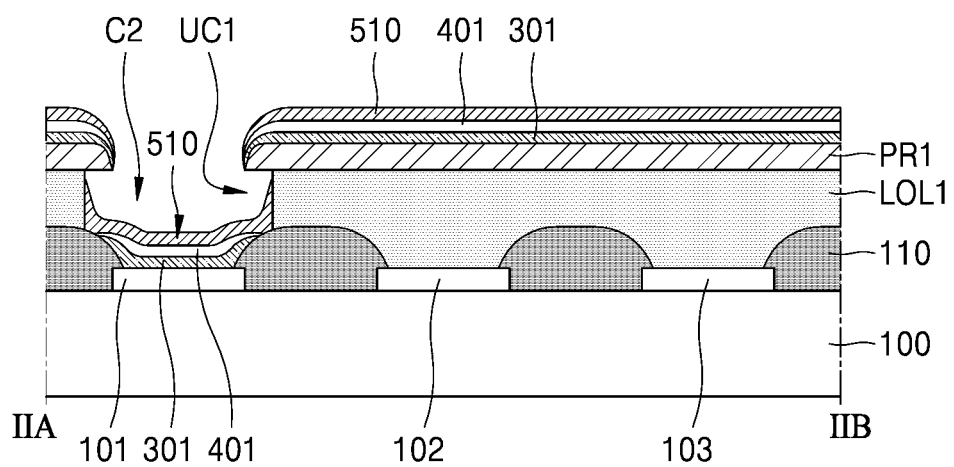

FIG. 12 is a cross-sectional view of the organic light-emitting display apparatus 3 according to the third exemplary embodiment. FIGS. 13A through 13C are cross-sectional views illustrating a part of a first unit process of the organic light-emitting display apparatus 3 according to the third exemplary embodiment.

Referring to FIG. 12, in the organic light-emitting display apparatus 3 according to the third exemplary embodiment, a plurality of pixel electrodes including the first pixel electrode 101, the second pixel electrode 102, and the third pixel electrode 103 are located on the substrate 100 to be spaced apart from one another, and the pixel-defining film 110 covers end portions of the first through third pixel electrodes 101, 102, and 103.

The first through third intermediate layers 301, 302, and 303 including the first through third emission layers (not shown) are respectively located on the first through third pixel electrodes 101, 102, and 103, and the first through third counter electrodes 401, 402, and 403 are respectively located on the first through third intermediate layers 301, 302, and 303. The first through third passivation layers 510, 520, and 530 are respectively located on the first through third counter electrodes 401, 402, and 403.

The first through third pixel electrodes 101, 102, and 103, the first through third intermediate layers 301, 302, and 303, the first through third counter electrodes 401, 402, and 403, and the first through third passivation layers 510, 520, and 530 have island patterns.

The first through third passivation layers 510, 520, and 530 include the first through third cover portions 511, 521, and 531 covering top surfaces of the first through third counter electrodes 401, 402, and 403 and the first through third protrusions 512, 522, and 532 respectively extending from the first through third cover portions 511, 521, and 531. In the present embodiment of the disclosure, the first through third protrusions 512, 522, and 532 have widths decreasing away from the substrate 100, as in FIG. 10.

Although widths of the first through third passivation layers 510, 520, and 530 are greater than widths of the first through third intermediate layers 301, 302, and 303 and the first through third counter electrodes 401, 402, and 403 in the present exemplary embodiment, there is a difference in that a third width W3 between an end portion of the first cover portion 511 and an end portion of the first counter electrode 401 is less than the second width W2 of the first cover portion 511 of FIG. 10.

The encapsulation member 700 is located covering top surfaces of the first through third passivation layers 510, 520, and 530. The encapsulation member 700 may include at least one organic layer and at least one inorganic layer. In FIG. 12, the first inorganic layer 701, the organic layer 702, and the second inorganic layer 703 are sequentially stacked.

Referring to FIG. 13A, as the same process as a process of FIGS. 5A through 5C is performed, the first through third pixel electrodes 101, 102, and 103 are located on the substrate 100 to be spaced apart from one another, and the pixel-defining film 110 covers end portions of the first through third pixel electrodes 101, 102, and 103.

The second opening C2 and the first undercut profile UC1 with a third depth D3 are formed by developing the first photoresist PR1 and etching the first lift-off layer LOL1. The third depth D3 of the first undercut profile UC1 in the present exemplary embodiment may be less than the first depth D1 of the first undercut profile UC1 of FIG. 5C.

Referring to FIG. 13B, the first intermediate layer 301 including the first emission layer (not shown), the first counter electrode 401, and the first passivation layer 510 are continuously deposited on a structure of FIG. 13A.

As a result of deposition, the first intermediate layer 301, the first counter electrode 401, and the first passivation layer 510 are deposited on a top surface of the first pixel electrode 101 in the second opening C2, a top surface of a part of the pixel-defining film 110, and on the first photoresist PR1.

Unlike in FIGS. 5D and 5E, in the present exemplary embodiment, there is no need to deposit the first passivation layer 510 by using CVD or ALD. The protrusion 512 (see FIG. 13C) may be formed on a side surface of the first lift-off layer LOL1 by depositing the first passivation layer 510 having low step coverage by forming the first undercut profile UC1 to have the third depth D3 that is relatively small, without increasing the step coverage of the first passivation layer 510.

Figure 13C:
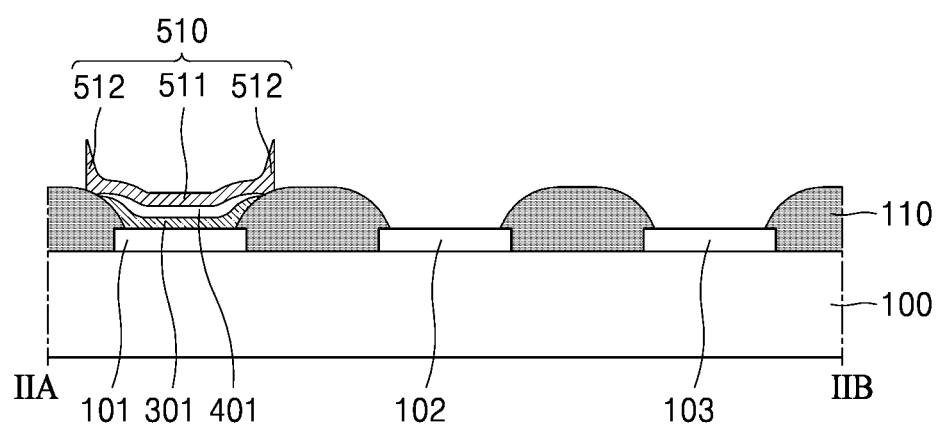

Referring FIG. 13C, a lift-off process is performed on a structure of FIG. 13B. Although a process of dissolving the first lift-off layer LOL1 with a solvent is performed in FIG. 5G, the first lift-off layer LOL1, which remains, is removed by using the lift-off process in the present exemplary embodiment.

As the first lift-off layer LOL1 is removed by using the lift-off process, the first photoresist PR1 located on the first lift-off layer LOL1 and the first intermediate layer 301, the first counter electrode 401, and the first passivation layer 510 remaining on the first photoresist PR1 are also removed along with the first lift-off layer LOL1. The lift-off process may be performed outside a chamber, thereby simplifying a process.

An organic light-emitting display apparatus 4 and a method of manufacturing the same according to a fourth exemplary embodiment of the present invention will now be described with reference to FIGS. 14 through 15C.

Figure 14:
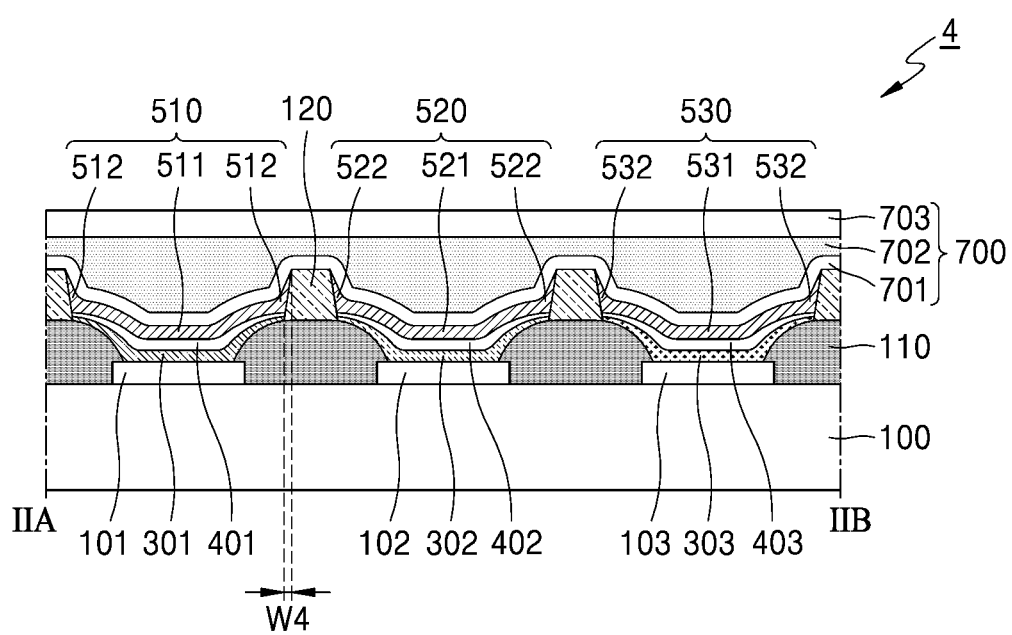
FIG. 14 is a cross-sectional view of an organic light-emitting display apparatus according to a fourth exemplary embodiment of the present invention.

FIG. 14 is a cross-sectional view of the organic light-emitting display apparatus 4 according to the fourth exemplary embodiment. FIGS. 15A through 15D are cross-sectional views illustrating parts of first through third unit processes of the organic light-emitting display apparatus 4 according to the fourth exemplary embodiment.

Referring to FIG. 14, in the organic light-emitting display apparatus 4 according to the fourth exemplary embodiment, a plurality of pixel electrodes including the first pixel electrode 101, the second pixel electrode 102, and the third pixel electrode 103 are located on the substrate 100 to be spaced apart from one another, and the pixel-defining film 110 covers end portions of the first through third pixel electrodes 101, 102, and 103.

In the present exemplary embodiment, an additional structure 120 is further located on a top surface of the pixel-defining film 110, the first through third intermediate layers 301, 302, and 303 including the first through third emission layers (not shown) are respectively located on the first through third pixel electrodes 101, 102, and 103, and the first through third counter electrodes 401, 402, and 403 are respectively located on the first through third intermediate layers 301, 302, and 303. The first through third passivation layers 510, 520, and 530 are located on the first through third counter electrodes 401, 402, and 403.

The first through third intermediate layers 301, 302, and 303, the first through third counter electrodes 401, 402, and 403, and the first through third passivation layers 510, 520, and 530 are formed on the first through third pixel electrodes 101, 102, and 103 to have island patterns in openings formed by the pixel-defining film 110 and the additional structure 120.

The first through third passivation layers 510, 520, and 530 include the first through third cover portions 511, 521, and 531 covering top surfaces of the first through third counter electrodes 401, 402, and 403 and the first through third protrusions 512, 522, and 532 respectively extending from the first through third cover portions 511, 521, and 531. While the first through third protrusions 512, 522, and 532 have widths decreasing away from the substrate 100 like in FIG. 12, there is a difference in that the additional structure 120 is located between the first through third protrusions 512, 522, and 532.

The additional structure 120 is located between the first through third protrusions 512, 522, and 532, and the first through third protrusions 512, 522, and 532 contact a surface of the additional structure 120, thereby improving durability.

Although widths of the first through third passivation layers 510, 520, and 530 are greater than widths of the first through third intermediate layers 301, 302, and 303 and the first through third counter electrodes 401, 402, and 403 in the present exemplary embodiment, there is a difference in that a fourth width W4 between an end portion of the first cover portion 511 and an end portion of the first counter electrode 401 is less than the second width W2 of FIG. 10.

The encapsulation member 700 covering top surfaces of the first through third passivation layers 510, 520, and 530 is located. The encapsulation member 700 may include at least one organic layer and at least one inorganic layer. In FIG. 14, the first inorganic layer 701, the organic layer 702, and the second inorganic layer 703 are sequentially stacked.

Figure 15A:
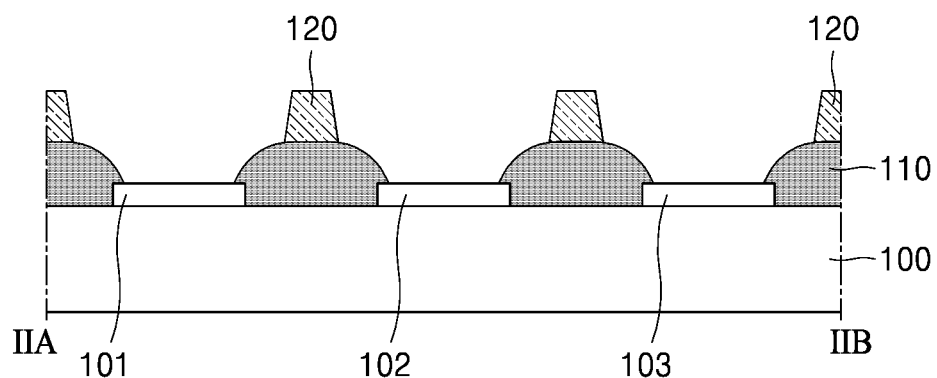
FIGS. 15A, 15B, 15C, and 15D are cross-sectional views illustrating parts of first through third unit processes of the organic light-emitting display apparatus according to the fourth exemplary embodiment.

Referring to FIG. 15A, the first pixel electrode 101, the second pixel electrode 102, and the third pixel electrode 103 are located on the substrate 100 to be spaced apart from one another, and the pixel-defining film 110 covering end portions of the first pixel electrode 101, the second pixel electrode 102, and the third pixel electrode 103 is formed.

In the present exemplary embodiment, the additional structure 120 is formed on the pixel-defining film 110. The additional structure 120 may include a material that is the same as or different from that of the pixel-defining film 110. When the additional structure 120 includes the same material as that of the pixel-defining film 110, the pixel-defining film 110 and the additional structure 120 may be formed by using one half-tone mask process.

Figure 15B:
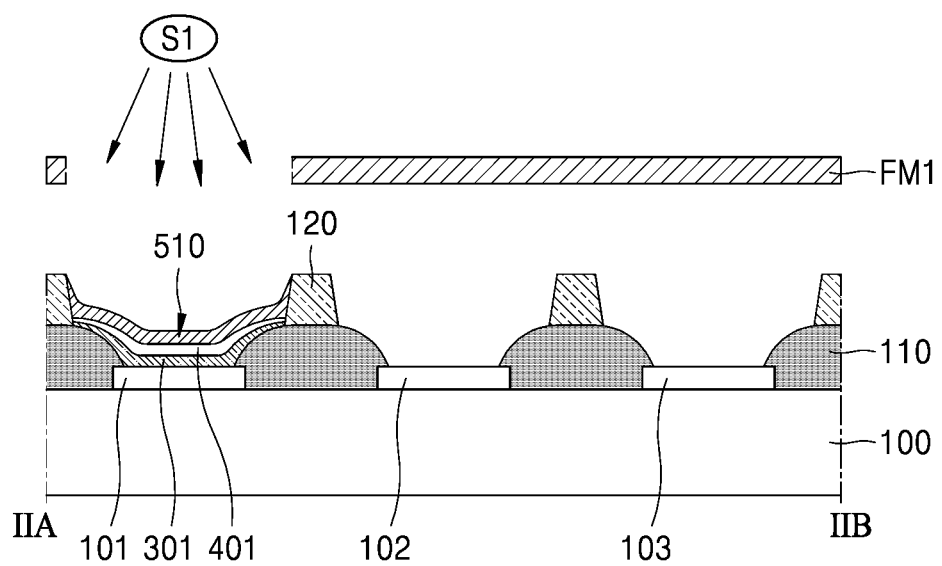

Referring to FIG. 15B, a first FMM FM1 having a transmission window at a position corresponding to the first pixel electrode 101 is located on the substrate 100 including the additional structure 120, and the first intermediate layer 301, the first counter electrode 401, and the first passivation layer 510 are deposited by adjusting a deposition angle of incidence so that a material emitted through a first deposition source S1 is incident on the substrate 100.

Figure 15C:
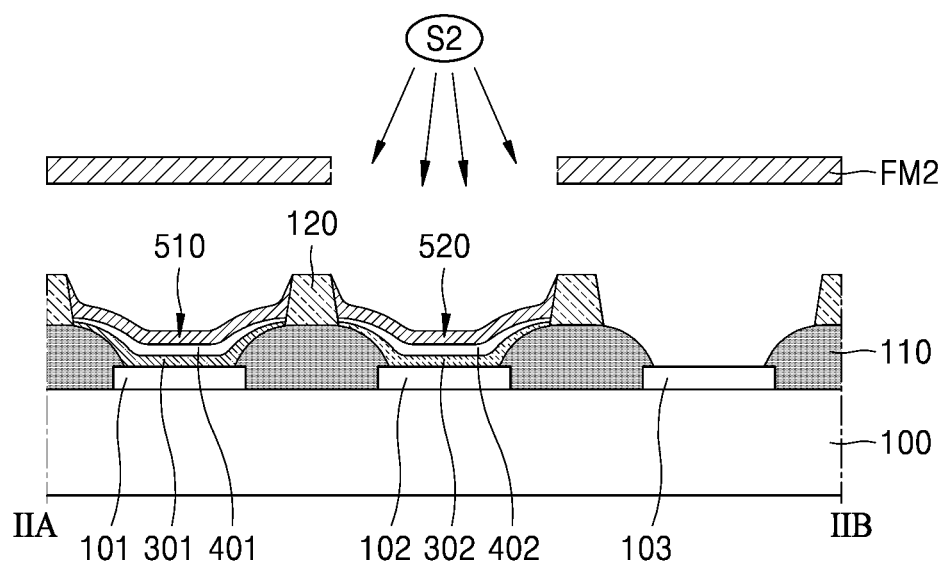

Referring to FIG. 15C, after a first unit process of FIG. 15B, a second FMM FM2 having a transmission window at a position corresponding to the second pixel electrode 102 is located on the substrate 100 including the additional structure 120, and the second intermediate layer 302, the second counter electrode 402, and the second passivation layer 520 are deposited by adjusting a deposition angle of incidence so that a material emitted through a second deposition source S2 is incident on the substrate 100.

Figure 15D:
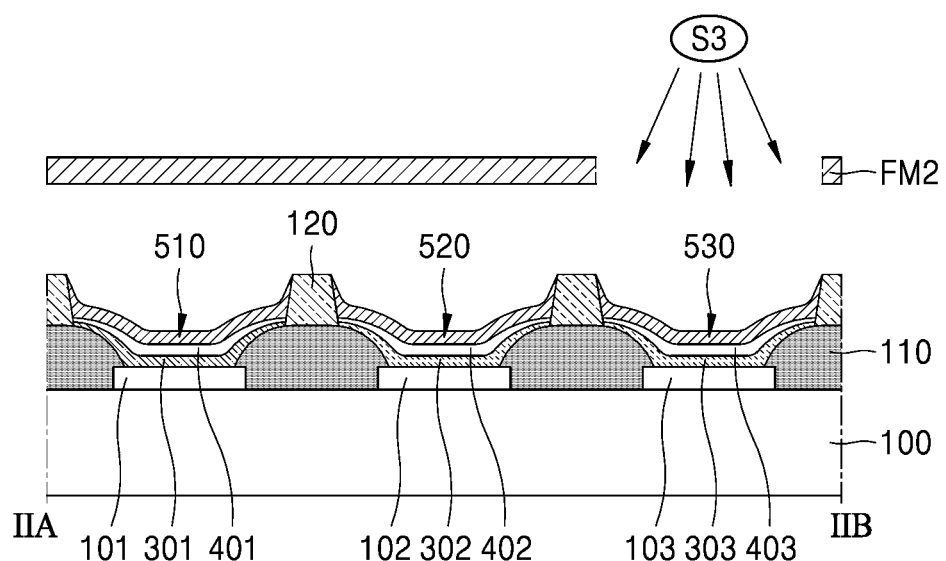

Referring to FIG. 15D, after a second unit process of FIG. 15C, a third FMM FM3 having a transmission window at a position corresponding to the third pixel electrode 103 is located on the substrate 100 including the additional structure 120, and the third intermediate layer 303, the third counter electrode 403, and the third passivation layer 530 are deposited by adjusting a deposition angle of incidence so that a material emitted through a third deposition source S3 is incident on the substrate 100.

As a result of the first through third unit processes, the first through third protrusions 512, 522, and 532 of the first through third passivation layers 510, 520, and 530 are formed to contact a surface of the additional structure 120, thereby improving the durability of a reflective plate.

According to exemplary embodiments of the present invention, because an intermediate layer including an emission layer is formed by using a lift-off process instead of a deposition process using an FMM, misalignment of the FMM may be prevented and manufacturing costs may be reduced.

Also, according to exemplary embodiments of the present invention, because a passivation layer is formed by using a vapor deposition method having good step coverage to completely cover a counter electrode, the number of defects of an OLED may be reduced.

Also, according to an exemplary embodiment of the present invention, because a protrusion of the passivation layer located outside the counter electrode and extending away from a substrate functions as a reflective plate for reflecting light emitted by the OLED, an emission area may be enlarged.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An organic light-emitting display apparatus comprising:
    a substrate;
    a pixel electrode disposed on the substrate;
    a pixel-defining film covering an end portion of the pixel electrode;
    an intermediate layer disposed on the pixel electrode and comprising an emission layer;
    a counter electrode disposed on the intermediate layer;
    a passivation layer disposed on the counter electrode and comprising a cover portion covering a top surface of the counter electrode and a protrusion extending in a direction away from the substrate from an end portion of the cover portion; and
    an encapsulation member covering the passivation layer.

2. The organic light-emitting display apparatus of claim 1, wherein an area of the cover portion of the passivation layer is greater than an area of the counter electrode.

3. The organic light-emitting display apparatus of claim 1, wherein the protrusion of the passivation layer has a closed loop shape surrounding the counter electrode.

4. The organic light-emitting display apparatus of claim 1, wherein the protrusion of the passivation layer has a width decreasing away from the substrate.

5. The organic light-emitting display apparatus of claim 1, wherein a reflectance of the pixel electrode is higher than a reflectance of the counter electrode.

6. The organic light-emitting display apparatus of claim 5, wherein a reflectance of the pixel electrode is higher than a reflectance of the passivation layer.

7. The organic light-emitting display apparatus of claim 1, wherein the end portion of the cover portion directly contacts a top surface of the pixel-defining film.

8. The organic light-emitting display apparatus of claim 7, wherein a bottom surface of the protrusion directly contacts the top surface of the pixel-defining film.

9. The organic light-emitting display apparatus of claim 1, further comprising an additional structure having a closed loop shape on the pixel-defining film.

10. The organic light-emitting display apparatus of claim 1, wherein the intermediate layer has an island pattern.

11. The organic light-emitting display apparatus of claim 1, wherein the counter electrode has an island pattern.

12. The organic light-emitting display apparatus of claim 1, wherein the encapsulation member comprises at least one organic layer comprising an organic material and at least one inorganic layer comprising an inorganic material.

13. The organic light-emitting display apparatus of claim 12, wherein the at least one organic layer directly contacts the passivation layer, and the at least one inorganic layer is disposed on the at least one organic layer.

14. The organic light-emitting display apparatus of claim 12, wherein the at least one inorganic layer comprises a first inorganic layer directly contacting the passivation layer and a second inorganic layer disposed on the at least one organic layer.

* * * * *